United States Patent
Cook et al.

(10) Patent No.: US 9,363,935 B1
(45) Date of Patent: Jun. 7, 2016

(54) SUBDIVIDED SEPARATION FILLERS FOR USE IN CABLES

(71) Applicant: Superior Essex Communications LP, Atlanta, GA (US)

(72) Inventors: Thomas Christopher Cook, Woodstock, GA (US); Bernhart A Gebs, Powder Springs, GA (US); Christopher W McNutt, Woodstock, GA (US)

(73) Assignee: Superior Essex Communications LP, Atlanta, GA (US)

( * ) Notice: Subject to any disclaimer, the term of this patent is extended or adjusted under 35 U.S.C. 154(b) by 364 days.

(21) Appl. No.: 13/835,800

(22) Filed: Mar. 15, 2013

Related U.S. Application Data

(63) Continuation-in-part of application No. 12/653,804, filed on Dec. 18, 2009, now Pat. No. 8,450,606, which is a continuation-in-part of application No. 12/313,914, filed on Nov. 25, 2008, now Pat. No. 7,923,641, which is a continuation-in-part of application No. 11/502,777, filed on Aug. 11, 2006, now abandoned.

(60) Provisional application No. 61/669,289, filed on Jul. 9, 2012, provisional application No. 61/709,327, filed on Oct. 3, 2012.

(51) Int. Cl.
*H01B 11/04* (2006.01)
*H05K 9/00* (2006.01)
*H01B 7/00* (2006.01)

(52) U.S. Cl.
CPC ............ *H05K 9/0098* (2013.01); *H01B 7/00* (2013.01)

(58) Field of Classification Search
CPC ........................................ H01B 11/06
USPC ........................... 174/113 R, 113 C
See application file for complete search history.

(56) References Cited

U.S. PATENT DOCUMENTS

| | | | |
|---|---|---|---|
| 2,538,019 | A | 1/1951 | Edwin |
| 2,796,463 | A | 6/1957 | Mallinkrodt |
| 3,090,825 | A | 5/1963 | Volk |
| 3,135,935 | A | 6/1964 | Eugelbrecht |
| 3,312,774 | A | 4/1967 | Drinko |

(Continued)

FOREIGN PATENT DOCUMENTS

| | | |
|---|---|---|
| GB | 2432963 | 6/2007 |
| JP | 200090748 | 3/2000 |

(Continued)

OTHER PUBLICATIONS

"Product Catalogue" 2 pages, Enterprise Cabling R&M, May 2006.

(Continued)

*Primary Examiner* — Chau N Nguyen

(57) ABSTRACT

Cables incorporating discontinuous separators or separation fillers are described. A cable may include a plurality of twisted pairs of individually insulated electrical conductors, and a separator may be disposed between at least two of the plurality of twisted pairs. The separator may include a plurality of discrete sections respectively positioned along a longitudinal length of the cable and each section may optionally include electrically conductive material. A jacket may be formed around the plurality of twisted pairs and the separator.

20 Claims, 11 Drawing Sheets

(56) References Cited

U.S. PATENT DOCUMENTS

| | | | |
|---|---|---|---|
| 3,373,475 | A | 3/1968 | Peterson |
| 4,129,841 | A | 12/1978 | Hildebrand et al. |
| 4,327,246 | A | 4/1982 | Kincaid |
| 4,604,497 | A | 8/1986 | Bell et al. |
| 4,638,272 | A | 1/1987 | Ive |
| 4,746,767 | A | 5/1988 | Gruhn |
| 4,881,642 | A | 11/1989 | Adam |
| 4,912,283 | A | 3/1990 | O'Connor |
| 5,006,806 | A | 4/1991 | Rippingale |
| 5,008,489 | A | 4/1991 | Weeks et al. |
| 5,106,175 | A | 4/1992 | Davis et al. |
| 5,114,517 | A | 5/1992 | Rippingale et al. |
| 5,473,336 | A | 12/1995 | Harman et al. |
| 5,952,615 | A * | 9/1999 | Prudhon .................... 174/113 C |
| 5,956,445 | A | 9/1999 | Deitz et al. |
| 6,207,901 | B1 | 3/2001 | Smith et al. |
| 6,506,976 | B1 * | 1/2003 | Neveux, Jr. ................ 174/113 R |
| 6,677,518 | B2 | 1/2004 | Hirakawa et al. |
| 6,687,437 | B1 | 2/2004 | Starnes et al. |
| 6,723,925 | B2 | 4/2004 | Ohara et al. |
| 6,737,574 | B2 | 5/2004 | Sylvia et al. |
| 6,770,819 | B2 | 8/2004 | Patel |
| 6,831,231 | B2 | 12/2004 | Perelman et al. |
| 6,850,161 | B1 | 2/2005 | Elliott |
| 6,888,070 | B1 * | 5/2005 | Prescott .................... 174/113 C |
| 7,173,189 | B1 | 2/2007 | Hazy et al. |
| 7,179,999 | B2 | 2/2007 | Clark et al. |
| 7,208,683 | B2 * | 4/2007 | Clark ..................... H01B 11/04 174/110 R |
| 7,329,815 | B2 | 2/2008 | Kenny et al. |
| 7,332,676 | B2 | 2/2008 | Sparrowhawk |
| 7,335,837 | B2 | 2/2008 | Pfeiler et al. |
| 7,600,723 | B2 * | 10/2009 | Borchers .............. H02G 3/0487 138/112 |
| 7,834,270 | B2 | 11/2010 | Zhu et al. |
| 7,834,271 | B2 | 11/2010 | Gromko et al. |
| 7,923,632 | B2 | 4/2011 | Smith et al. |
| 7,923,641 | B2 | 4/2011 | Smith et al. |
| 8,119,906 | B1 | 2/2012 | Smith et al. |
| 8,445,787 | B2 | 5/2013 | Nordin et al. |
| 8,558,115 | B2 | 10/2013 | Jenner et al. |
| 2003/0217863 | A1 | 11/2003 | Clark et al. |
| 2006/0048961 | A1 | 3/2006 | Pfeiler et al. |
| 2007/0037419 | A1 | 2/2007 | Sparrowhawk |
| 2007/0224495 | A1 | 9/2007 | Gibbons et al. |
| 2007/0275583 | A1 * | 11/2007 | McNutt et al. ................ 439/225 |
| 2008/0255435 | A1 | 10/2008 | Al-Ali et al. |
| 2008/0314636 | A1 | 12/2008 | Ogura |
| 2009/0200060 | A1 | 8/2009 | Smith et al. |
| 2009/0223694 | A1 | 9/2009 | Nordin et al. |
| 2009/0272571 | A1 | 11/2009 | Gromko |
| 2010/0096179 | A1 * | 4/2010 | Sparrowhawk et al. ...... 174/350 |
| 2010/0101853 | A1 | 4/2010 | McNutt |
| 2010/0224389 | A1 | 9/2010 | Jenner et al. |
| 2011/0147039 | A1 | 6/2011 | Smith et al. |

FOREIGN PATENT DOCUMENTS

| | | |
|---|---|---|
| JP | 2004311120 | 11/2004 |
| JP | 2006173044 | 6/2006 |
| WO | WO2006105166 | 5/2006 |

OTHER PUBLICATIONS

"Draka" 12 pgs., Draka Comteq, Cable Solutions, Data cables, Sep. 27, 2006.

"10 Gigabit Ethernet Solutions" 8pgs., R&M Convincing Cabling Solutions.

Wetzikon, "R&M: The Rising Stars in Copper Cabling" 2pgs., Sep. 1, 2005.

"R&M Star Real 10" 2pgs., Mar. 2006.

"Connections 29" 36 pgs., Sep. 2005.

Pfeiler et al., U.S. Pat. No. 7,335,837, issued Feb. 26, 2008.

First Office Action for U.S. Appl. No. 13/827,359, mailed on Aug. 7, 2014.

Non-Final Rejection for U.S. Appl. No. 13/827,257, mailed on Jan. 14, 2015.

Final Office Action mailed on Mar. 3, 2015 for U.S. Appl. No. 13/827,359.

Office Action, mailed on Jul. 16, 2015, for U.S. Appl. No. 14/271,800.

Notice of Allowance and Fee(s) Due in U.S. Appl. No. 14/578,921, mailed on Oct. 9, 2015.

Notice of Allowance and Fee(s) Due in U.S. Appl. No. 13/827,359, mailed on Oct. 2, 2015.

Office Action, mailed on Jan. 13, 2016, for the U.S. Appl. No. 14/271,800.

\* cited by examiner

SUBDIVIDED SEPARATION FILLERS FOR USE IN CABLES

CROSS-REFERENCES TO RELATED APPLICATIONS

This application claims priority to U.S. Provisional Application No. 61/669,289, filed Jul. 9, 2012, and entitled "Subdivided Separation Filler for Use in Cables" and to U.S. Provisional Application No. 61/709,327, filed Oct. 3, 2013, and entitled "Separation Filler for Use in Cables." Additionally, this application is a continuation-in-part of co-pending U.S. patent application Ser. No. 12/653,804, filed Dec. 19, 2008, and entitled "Communication Cable Having Electrically Isolated Shield Providing Enhanced Return Loss," which is a continuation-in-part of U.S. patent application Ser. No. 12/313,914 (Now U.S. Pat. No. 7,923,641), filed Nov. 25, 2008, and entitled "Communication Cable Comprising Electrically Isolated Patches of Shielding Material," which is a continuation-in-part of U.S. patent application Ser. No. 11/502,777, filed Aug. 11, 2006, and entitled "Method and Apparatus for Fabricating Noise-Mitigating Cable." The entire contents of each of these matters are incorporated by reference herein.

Additionally, this application is related to U.S. patent application Ser. No. 12/313,910 (Now U.S. Pat. No. 7,923,632), filed Nov. 25, 2008, and entitled "Communication Cable Comprising Electrically Discontinuous Shield Having Nonmetallic Appearance"; U.S. patent application Ser. No. 12/583,797 (Now U.S. Pat. No. 8,119,906), filed Aug. 26, 2009, and entitled "Communication Cable Shielded With Mechanically Fastened Shielding Elements"; U.S. patent application Ser. No. 12/584,672 (Now U.S. Pat. No. 8,119,907), filed Sep. 10, 2009, and entitled "Communication Cable With Electrically Isolated Shield Comprising Holes"; U.S. patent application Ser. No. 13/039,918, filed Mar. 3, 2011, and entitled "Communication Cable Comprising Electrically Discontinuous Shield Having Nonmetallic Appearance"; and U.S. patent application Ser. No. 13/039,923, filed Mar. 3, 2011, and entitled "Communication Cable Comprising Electrically Discontinuous Shield Having Nonmetallic Appearance". The entire contents of each of these matters are incorporated by reference herein.

TECHNICAL FIELD

Embodiments of the disclosure relate generally to cables and, more particularly, to separation fillers or separators for use in cables.

BACKGROUND

A wide variety of different types of cables are utilized to transmit power and/or communications signals. In certain types of cables, it is desirable to separate internal cable components. For example, certain cables make use of multiple twisted pairs of conductors to communicate signals. In each pair, the wires are twisted together in a helical fashion to form a balanced transmission line. When twisted pairs are placed in close proximity, such as within the core of a cable, electrical energy may be transferred from one pair of the cable to another pair. Such energy transfer between pairs is undesirable and is referred to as crosstalk. Crosstalk causes interference to the information being transmitted through the twisted pairs and can reduce the data transmission rate and cause an increase in bit rate error. Interlinking typically occurs when two adjacent twisted pairs are pressed together, and interlinking can lead to an increase in crosstalk among the wires of adjacent twisted pairs.

In order to improve crosstalk performance, separators (also referred to as separation fillers, fillers, interior supports, or splines) have been inserted into many conventional cables. These separators serve to separate adjacent twisted pairs and limit or prevent interlinking of the twisted pairs. However, conventional separators are continuous along the length of a cable and, as a result, reduce the flexibility of the cable while increasing materials cost. Additionally, in some cables, external shielding is wrapped around twisted pairs to limit or reduce electrical interference. However, the presence of shields further increases the stiffness of a cable. Cables that are stiffer are typically more susceptible to induced signal loss during processing, packaging, and installation. Additionally, cable installers typically prefer relatively flexible cables when available. Accordingly, there is an opportunity for improved separators or separation fillers for use in cables. There is additionally an opportunity for separators or separation fillers that improve or enhance cable flexibility.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items; however, various embodiments may utilize elements and/or components other than those illustrated in the figures. Additionally, the drawings are provided to illustrate example embodiments described herein and are not intended to limit the scope of the disclosure.

DETAILED DESCRIPTION

Figure 1:
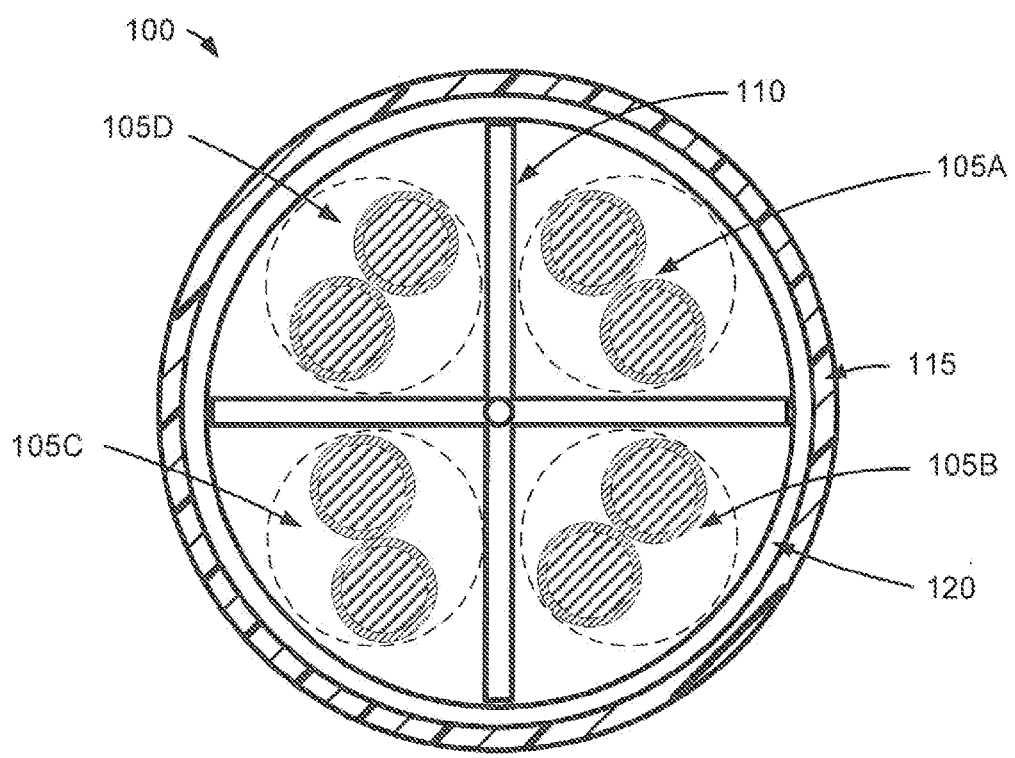
FIG. 1 is a cross-sectional view of an example cable including a separator, according to an illustrative embodiment of the disclosure.

Various embodiments of the present disclosure are directed to cables that incorporate non-continuous or subdivided separation fillers or separators. In accordance with one example embodiment, a cable may include one or more separators, such as a central separator utilized to separate a multitude of twisted pairs or other cable components. A separator may function to position or orient the twisted pairs along a longitudinal direction of the cable. Additionally, in accordance with an aspect of the disclosure, the separator may be non-continuous along a length of the cable. In other words, the separator may be non-continuous, separated, segmented, or severed in a longitudinal direction such that discrete sections or portions of the separator are arranged longitudinally (e.g., end to end) along a length of the cable. As a result, the flexibility of the cable may be enhanced relative to that of a cable with a continuous or non-segmented separator. Additionally, an amount of material utilized to form the separator, and therefore the cable, may be reduced relative to that of a cable with a continuous separator. Accordingly, in certain embodiments, the cost of forming the cable may be reduced.

In certain embodiments, a separator may additionally include or incorporate electrically conductive material that functions as a shield (or partial shield) to limit or reduce crosstalk and/or other interference between cable components (e.g., two or more twisted pairs, etc.). For example, a plurality of discrete segments or portions of the separator may incorporate electrically conductive material, such as one or more metallic patches (or other suitable conductive material) formed or adhered to a dielectric substrate or base, electrically conductive material embedded into a dielectric material, electrically conductive material impregnated into a dielectric material, or relatively solid sections of electrically conductive material. In certain embodiments, electrically conductive material (e.g., a single patch of electrically conductive material, a plurality of discontinuous patches of electrically conductive material, etc.) may be incorporated into a separator segment between two dielectric ends. In this regard, in the event that adjacent segments of the separator contact one another within a cable, electrical discontinuity of the electrically conductive material may be maintained. In other words, the electrically conductive material incorporated into a first segment will not contact the electrically conductive material incorporated into a second segment. In other embodiments, one of the dielectric ends may be omitted from a portion or all of the separator segments.

As desired in various embodiments, a cable may additionally incorporate one or more shield or shielding layers. For example, an external shield may circumscribe a plurality of twisted pairs (and/or other cable components). As another example, a portion or all of the twisted pairs (and/or other cable components) may be individually shielded. As yet another example, one or more subgroups of twisted pairs (and/or other cable components) may be shielded. In other embodiments, any combination of shielding arrangements may be utilized. For example a cable may include individually shielded twisted pairs and an overall shield. As desired, one or more shield layers incorporated into the cable may include electrically conductive material, such as one or more patches of electrically conductive material (e.g., metallic material, etc.). In certain embodiments, both a separator and a shield layer may include discontinuous patches of electrically conductive material. In other words, both the separator and shield layer may include a plurality of patches with gaps or spaces formed between adjacent patches. As desired, these gaps or spaces may correspond with one another.

Additionally, in certain embodiments, a cable may include both a separator positioned between a plurality of twisted pairs and a shield layer formed around the twisted pairs and the separator. In this regard, the separator may provide for shielding between the twisted pairs, and the external shield may shield the twisted pairs from external signals. As a result, the performance of the cable may be similar to a cable in which each of the twisted pairs is individually shielded (i.e., a shielded twisted pair ("STP") cable). In other words, the cable may function as an alternative to conventional STP cables. However, the cable may be easier to terminate by a technician relative to conventional STP cables. With a conventional STP cable, the pair shield must be removed from each set of twisted pairs to facilitate termination. However, with a cable including a shielding separator and external shield layer, each set of twisted pairs may be accessed by simply removing the external shield.

Embodiments of the disclosure now will be described more fully hereinafter with reference to the accompanying drawings, in which certain embodiments of the disclosure are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

With reference to FIG. 1, a cross-section of an example cable 100 that may be utilized in various embodiments is illustrated. The cable 100 is illustrated as a communications cable; however, other types of cables may be utilized. The cable 100 may include any number of transmission media, such as one or more twisted pairs, one or more optical fibers, one or more coaxial cables, and/or one or more power conductors. In certain embodiments, the cable 100 may include a combination of twisted pairs and one or more other types of transmission media (e.g., optical fibers, etc.). As shown in FIG. 1, the cable 100 may include four twisted pairs 105A, 105B, 105C, 105D; however, any other number of pairs may be utilized. As desired, the twisted pairs may be twisted or bundled together and/or suitable bindings may be wrapped around the twisted pairs. In yet other embodiments, multiple grouping of twisted pairs may be incorporated into a cable. As desired, each grouping may be twisted, bundled, and/or bound together. Further, in certain embodiments, the multiple groupings may be twisted, bundled, or bound together. Additionally, embodiments of the disclosure may be utilized in association with horizontal cables, vertical cables, flexible cables, equipment cords, cross-connect cords, plenum cables, riser cables, or any other appropriate cables.

According to an aspect of the disclosure, the cable 100 may also include a separator 110 (also referred to as a separation filler, a filler, an interior support, or a spline) configured to orient and or position one or more of the twisted pairs 105A-D, as well as an outer jacket 115. Each twisted pair (referred to generally as twisted pair 105 or collectively as twisted pairs 105) may include two electrical conductors, each covered with suitable insulation. As desired, each of the twisted pairs may have the same twist lay length or alternatively, at least two of the twisted pairs may include a different twist lay length. The different twist lay lengths may function to reduce crosstalk between the twisted pairs. Additionally, in certain embodiments, each of the twisted pairs may be twisted in the same direction (e.g., clockwise, counter clockwise). In other embodiments, at least two of the twisted pairs may be twisted in opposite directions. The insulation may include any suitable dielectric materials (e.g., a polymeric material, polyvinyl chloride ("PVC"), polyurethane, one or more polymers, a fluoropolymer, polyethylene, polypropylene, neoprene, cholorosulphonated polyethylene, fluorinated ethylene propylene ("FEP"), flame retardant PVC, low temperature oil resistant PVC, polyolefin, flame retardant polyurethane, flexible PVC, etc.) and/or combination of materials. In certain embodiments, the insulation may be foamed. As desired, different foaming levels may be utilized in accordance with twist lay length to result in insulated twisted pairs having an equivalent or approximately equivalent overall diameter. In certain embodiments, the insulation may additionally include other materials, such as a flame retardant material and/or a smoke suppressant material.

The jacket 115 may enclose the internal components of the cable 100, seal the cable 100 from the environment, and provide strength and structural support. The jacket may be formed from a wide variety of suitable materials, such as a polymeric material, polyvinyl chloride ("PVC"), polyurethane, one or more polymers, a fluoropolymer, polyethylene, polypropylene, neoprene, cholorosulphonated polyethylene, fluorinated ethylene propylene ("FEP"), flame retardant PVC, low temperature oil resistant PVC, polyolefin, flame retardant polyurethane, flexible PVC, low smoke zero halogen ("LSZH") material, or some other appropriate material known in the art, or a combination of suitable materials. In certain embodiments, the jacket 115 can include flame retardant and/or smoke suppressant materials. Additionally, the jacket 115 may include a wide variety of suitable shapes and/or dimensions. For example, the jacket 115 may be formed to result in a round cable or a cable having an approximately circular cross-section; however, the jacket 115 and internal components may be formed to result in other desired shapes, such as an elliptical, oval, or rectangular shape. The jacket 115 may also have a wide variety of dimensions, such as any suitable or desirable outer diameter and/or any suitable or desirable wall thickness. In various embodiments, the jacket 115 can be characterized as an outer jacket, an outer sheath, a casing, a circumferential cover, or a shell.

The jacket 115 can be single layer or have multiple layers. In certain embodiments, one or more tubes or shield layers can be disposed between the jacket 115 and one or more additionally cable components. For example, an external shield layer 120 may be disposed between the jacket 115 and the twisted pairs 105. In other embodiments, a shield layer (or shielding material) may be incorporated or embedded into the jacket or placed on the outside of the jacket. In yet other embodiments, a plurality of shield layers may be utilized. As another example, any number of cable components (e.g., optical fibers, twisted pairs, etc.) may be situated within one or more buffer tubes, such as polypropylene ("PP") buffer tubes, polyethylene ("PE") buffer tubes, or polybutylene terephthalate ("PBT") buffer tubes. As explained in greater detail below, a shield layer (or similarly a tube) may incorporate electrically conductive material in order to provide electrical shielding for one or more cable components. Further, in certain embodiments, the cable 100 may include a separate, armor layer (e.g., a corrugated armor, etc.) for providing mechanical protection.

Each twisted pair 105A, 105B, 105C, 105D can carry data or some other form of information, for example in a range of about one to ten Giga bits per second ("Gbps") or another appropriate frequency, whether faster or slower. In certain embodiments, each twisted pair 105A, 105B, 105C, 105D supports data transmission of about two and one-half Gbps (e.g. nominally two and one-half Gbps), with the cable 100 supporting about ten Gbps (e.g. nominally ten Gbps). In certain embodiments, each twisted pair 105A, 105B, 105C, 105D supports data transmission of about ten Gbps (e.g. nominally ten Gbps), with the cable 100 supporting about forty Gbps (e.g. nominally forty Gbps).

As set forth above, in certain embodiments, each twisted pair 105A, 105B, 105C, 105D may have a different twist rate. As desired, the differences between twist rates of twisted pairs 105 that are circumferentially adjacent one another (for example the twisted pair 105A and the twisted pair 105B) may be greater than the differences between twist rates of twisted pairs 105 that are diagonal from one another (for example the twisted pair 105A and the twisted pair 105C). As a result of having similar twist rates, the twisted pairs 105 that are diagonally disposed can be more susceptible to crosstalk issues than the twisted pairs 105 that are circumferentially adjacent; however, the distance between the diagonally disposed pairs may limit the crosstalk. Thus, the different twist lengths and arrangements of the pairs can help reduce crosstalk among the twisted pairs 105.

An opening enclosed by the jacket 115 may be referred to as a cable core, and the twisted pairs 105A, 105B, 105C, 105D may be disposed within the cable core. In certain embodiments, the cable core may be filled with a gas such as air (as illustrated) or alternatively a gelatinous, solid, powder, moisture absorbing material, water-swellable substance, dry filling compound, or foam material, for example in interstitial spaces between the twisted pairs 105. Other elements can be added to the cable core as desired, for example one or more optical fibers, additional electrical conductors, additional twisted pairs, and/or strength members, depending upon application goals.

As desired in various embodiments, the cable 100 may include shielding or, alternatively, may be unshielded. For example, a shield layer or shield 120 may be utilized to encase the twisted pairs 105. As shown in FIG. 1, the shield 120 may be an external shield that encompasses all of the twisted pairs 105. In certain embodiments, the shield 120 may be positioned between the twisted pairs 105 and the outer jacket 115. In other embodiments, the shield 120 may be embedded or incorporated into the outer jacket 115. In yet other embodiments, individual pairs or desired groupings of twisted pairs may be shielded. In yet other embodiments, a combination of shielding layers may be utilized. For example, one or more twisted pairs 105 may be individually shielded and an external shield may be wrapped around the individually shielded pairs.

As explained in greater detail below, a wide variety of suitable materials may be utilized to form a shield, such as shield 120. In certain embodiments, a relatively continuous shield may be formed from electrically conductive material, such as a metallic foil (e.g., a copper foil, an aluminum foil, an alloy foil, a multi-layer clad foil, etc.), a braided metallic material, etc. In other embodiments, a discontinuous shield may be utilized in a shield layer. A discontinuous shield may include a plurality of patches or sections of electrically conductive material. In other words, a discontinuous shield may include a system of electrically isolated patches or sections of shielding material, for example as described in U.S. patent application Ser. No. 12/313,914, entitled "Communication Cable Comprising Electrically Isolated Patches of Shielding Material" and U.S. patent application Ser. No. 12/653,804, entitled "Communication Cable Having Electrically Isolated Shield Providing Enhanced Return Loss." The entire contents of each of these applications are incorporated herein by reference. Patches or sections of electrically conductive material incorporated into a discontinuous shield may include any desired dimensions, such as any desired longitudinal length, any desired thickness, and/or any desired shape. Further, any desired spacing or gaps may be situated between adjacent patches of electrically conductive material in a shield. A few non-limiting examples of patch patterns that may be utilized in a discontinuous shield are described in greater detail below with reference to FIGS. 8A-8C.

A wide variety of suitable methods or techniques may be utilized to form a shield, such as shield 120. For example, electrically conductive material (e.g., a metallic material, an alloy, etc.), whether continuous or comprising electrically conductive patches or sections, can be disposed on a substrate or dielectric material. In certain embodiments, electrically conductive material may be disposed or formed on a dielectric tape or other suitable dielectric layer in order to form a shield. In other embodiments, electrically conductive material may be sandwiched between multiple dielectric layers in order to form a shield. In yet other embodiments, electrically conductive material may be adhered to a jacket, buffer tube, or other cable component in order to form a shield. In yet other embodiments, electrically conductive material may be incorporated into a jacket, buffer tube, or other cable component. Additionally, a wide variety of suitable electrically conductive materials or combination of materials may be utilized to form a shield (or electrically conductive patches incorporated into a shield) including, but not limited to, metallic material (e.g., silver, copper, annealed copper, gold, aluminum, etc.), metallic alloys, conductive composite materials, etc. Indeed, suitable electrically conductive materials may include any material having an electrical resistivity of less than approximately $1 \times 10^{-7}$ ohm meters at approximately 20° C. In certain embodiments, an electrically conductive material may have an electrical resistivity of less than approximately $3 \times 10^{-8}$ ohm meters at approximately 20° C.

With continued reference to FIG. 1, at least one separator, such as separator 110, may also be disposed within the cable core. The separator 110 may function to maintain a desired orientation of the twisted pairs 105 (or at least a portion of the twisted pairs 105) along a longitudinal direction of the cable. The orientation of the twisted pairs 105 may provide beneficial signal performance. In accordance with an aspect of the disclosure, the separator 110 may be non-continuous along a length of the cable 100. In other words, the separator 110 may be non-continuous, separated, segmented, or severed in a longitudinal direction such that discrete sections or portions of the separator 110 are arranged longitudinally (e.g., end to end) along a length of the cable 100. Amended The various portions or segments of the separator 110 may include a wide variety of different lengths and/or sizes as desired in various embodiments. For example, a portion of the separator 110 may have a length of approximately one half meter, one meter, one and a half meters, two meters, two and a half meters, three meters, or any value included in a range between any two of the above values, or any other suitable length. As another example, a portion of the separator 110 may have a length of approximately six inches, one foot, two feet, three feet, four feet, five feet, six feet, seven feet, eight feet, nine feet, or any value included in a range between any two of the above values, or any other suitable length. In certain embodiments, a separator segment may have a length that is less than or equal to approximately three meters. Accordingly, electrically conductive patches of material incorporated into the separator segments may have lengths of less than or equal to approximately three meters. In other embodiments, separator segments may be longer than three meters while discontinuous patches of electrically conductive material have lengths of less than or equal to approximately three meters. As a result, even if electrically conductive material is respectively incorporated into each of the separator segments, the potential of electrical arcing may be limited. In other embodiments, patches of electrically conductive material incorporated into separator segments may have lengths greater than approximately three meters. Additionally, in certain embodiments, such as the example embodiment illustrated in FIG. 4A, each of the separator segments or portions may have lengths that are approximately equal. In other embodiments, such as the example embodiment illustrated in FIG. 4B, various portions of the separator 110 may have varying lengths. These varying lengths may follow an established pattern or, alternatively, may be incorporated into the cable 100 at random.

Additionally, in certain embodiments, gaps or spaces may be present in the longitudinal direction of the cable 100 between two consecutive or adjacent portions of the separator 110. In other embodiments, adjacent portions of the separator 110 may be permitted to contact one another. In the event that adjacent portions are permitted to contact one another, relatively consistent and predictable stiffness (and in certain embodiments shielding) may be provided along a length of a cable; however, the discontinuity of the separator 110 may allow greater flexibility. In yet other embodiments, gaps may be present between some adjacent portions of the separator 110 while other adjacent portions are permitted to contact one another. In certain embodiments, the sizes of gaps or spaces between consecutive portions of the separator 110 may be approximately equal along a length of the cable 100. In other embodiments, the sizes of the gaps may be varied in accordance with a pattern or in a random manner. Additionally, a wide variety of suitable gap sizes may be utilized as desired in various embodiments. For example, a gap size may be approximately one centimeter, 2 centimeters, 3 centimeters, 5 centimeters, 10 centimeters, any value included in a range between any two of the above values, or any other suitable gap size. As another example, a gap size may be approximately one inch (or smaller), approximately 3 inches, approximately 6 inches, a value included in a range between any two of the above values, or any other suitable gap size. In certain embodiments, the gaps may be small enough to prevent the twisted pairs 105 from contacting each other in the interstitial spaces between portions of the separation filler.

As desired in various embodiments, each of the separator segments may be formed from a wide variety of suitable materials and/or combinations of materials. For example, the separator segments can include paper, metals, alloys, various plastics, polyolefins (e.g., polyethylene, polypropylene, etc.), fluoropolymers (e.g., fluorinated ethylene propylene, etc.), etc. polyurethane, flame retardant polyurethane, PVC, polyethylene, FEP, ethylene chlorotrifluoroethlyene ("ECTFE"), one or more fluoropolymers, neoprene, cholorosulphonated polyethylene, flame retardant PVC, low temperature oil resistant PVC, polyolefin, flexible PVC, low smoke zero halogen ("LSZH") material, various copolymers, or any other suitable materials or combination of materials. As desired, the separator segments may be filled, unfilled, foamed, un-foamed, homogeneous, or inhomogeneous and may or may not include additives. For example, the separator segments may include flame retardant and/or smoke suppressant materials.

In certain embodiments, each segment or portion of the separator 110 may be formed from similar materials. In other embodiments, a separator 110 may make use of alternating materials in adjacent portions (whether or not a gap is formed between adjacent portions). For example, a first portion or segment of the separator 110 may be formed from a first set of one or more materials, and a second portion or segment of the separator 110 may be formed from a second set of one or more materials. As one example, a relatively flexible material may be utilized in every other portion of a separator 110. As another example, relatively expensive flame retardant material may be selectively incorporated into desired portions of a separator 110. In this regard, material costs may be reduced while still providing adequate flame retardant qualities.

As desired in certain embodiments, one or more portions of the separator 110 may additionally include an adhesive that functions to bond the twisted pairs 105 to the separator 110. For example, a pressure sensitive adhesive (e.g., glue, etc.) or a hot melt adhesive (e.g., a thermoplastic, an elastomer, an elastomeric material, a thermoplastic elastomer, synthetic rubber, latex rubber, silicone rubber, silicone polyurethane, silicone, acrylic rubber, etc.) may be applied to the separator 110 during construction of the cable 100 (e.g., prior to forming the outer jacket 115, etc.), and the twisted pairs 105 may be brought into contact the adhesive. In certain embodiments, the adhesive may be applied in-line as the cable 100 is constructed. For example, a hot melt adhesive may be applied in liquid form to the separator 110, and the twisted pairs 105 may be brought into contact with the separator 110 before the adhesive cools.

The adhesive may include a higher coefficient of friction than other components of the separator 110, such as a coefficient of friction that is two, three, four, five, ten, or twenty times greater than other components of the separator 110. As a result, the adhesive may hold the twisted pairs 105 in place during construction of the cable 100 (e.g., prior to formation of the outer jacket 115), during storage, shipment, and installation of the cable 100 (e.g., as the cable 100 is drawn through a duct, etc.), and/or following installation of the cable 100 (e.g., as mechanical stress is exerted on a buried cable, etc.).

In certain embodiments, one or more portions of the separator 110 may additionally include or incorporate electrically conductive material that functions as a shield (or partial shield) to limit or reduce crosstalk and/or other interference between the twisted pairs 115 and/or any other cable components. For example, a plurality of discrete separator segments may incorporate electrically conductive material, such as one or more metallic patches (or other suitable conductive material) formed or adhered to a dielectric substrate or base, electrically conductive material embedded into a dielectric material, electrically conductive material impregnated into a dielectric material, or relatively solid sections of electrically conductive material. In certain embodiments, electrically conductive material (e.g., a single patch of electrically conductive material, a plurality of discontinuous patches of electrically conductive material, etc.) may be incorporated into a separator segment between two dielectric ends. In this regard, in the event that adjacent segments of the separator 110 contact one another within the cable 100, electrical discontinuity of the electrically conductive material may be maintained. In other words, the electrically conductive material incorporated into a first segment will not contact the electrically conductive material incorporated into a second segment. In other embodiments, one of the dielectric ends may be omitted from a portion or all of the separator segments.

Similar to the shield 120 described in greater detail above, a separator 110 may utilize a wide variety of different configurations of electrically conductive material in order to provide shielding. In certain embodiments, electrically conductive material incorporated into a separator segment may be continuous or relatively continuous along a length of the separator segment. In other embodiments, discontinuous patches of electrically conductive material may be incorporated into a separator segment. Additionally, a wide variety of suitable electrically conductive materials or combination of materials may be utilized as desired including, but not limited to, metallic material (e.g., silver, copper, annealed copper, gold, aluminum, etc.), metallic alloys, conductive composite materials, etc. Indeed, suitable electrically conductive materials may include any material having an electrical resistivity of less than approximately $1\times10^{-7}$ ohm meters at approximately 20° C., such as an electrical resistivity of less than approximately $3\times10^{-8}$ ohm meters at approximately 20° C. In the event that discontinuous patches or sections of electrically conductive material are utilized, the patches may have any desired dimensions, such as any desired lengths and/or thicknesses. Further, any desired gaps or spaces may be positioned between adjacent patches. Example patch and gap dimensions may be similar to those described above for the shield 120. Further, electrically conductive material incorporated into a separator segment may have a wide variety of suitable arrangements and/or shapes. A few example arrangements of electrically conductive material are described in greater detail below with reference to FIGS. 8A-8D.

As desired, a wide variety of suitable techniques and/or processes may be utilized to form the separator 110 and/or various separator segments. For example, a base material or dielectric material may be extruded, poltruded, or otherwise formed. In certain embodiments, electrically conductive material may then be applied or adhered to the base material. In other embodiments, electrically conductive material may be injected into the base material. In other embodiments, dielectric material may be formed or extruded over electrically conductive material in order to form a separator 110. Indeed, a wide variety of suitable techniques may be utilized to incorporate electrically conductive material into a separator 110. In other embodiments, no electrically conductive material is incorporated into a separator 110.

In certain embodiments, the base layer may have a substantially uniform composition and/or may be made of a wide range of materials. Additionally, the base layer may be fabricated in any number of manufacturing passes, such as a single manufacturing pass. Further, the base layer may be foamed, may be a composite, and/or may include one or more strength members, fibers, threads, or yarns. As desired, flame retardant material, smoke suppressants, and/or other desired substances may be blended or incorporated into the base layer. Additionally, as desired, the base layer may be hollow to provide a cavity that may be filled with air or some other gas, gel, fluid, moisture absorbent, water-swellable substance, dry filling compound, powder, one or more optical fibers, one or more metallic conductor (e.g., a drain wire, etc.), shielding, or some other appropriate material or element.

In certain embodiments, a single separator 110 may be formed and the separator may be severed or cut into segments as it is incorporated into a cable 100. For example, the separator 110 may be fed from a reel or bin into a suitable cabling machine. Other suitable reels or bins may feed twisted pairs 115. As the separator 110 is incorporated into the cable 100, the separator 110 may be severed at desired points in order to form a plurality of discrete separator segments. As desired, a suitable detector (e.g., an optical detector, a resistance detector, a conductivity detector, etc.) may be utilized to identify gaps or spaces between electrically conductive patches, and the separator 110 may be severed at the gaps or spaces. In other embodiments, discrete separator segments may be formed, and the individual segments may be incorporated into a cable 100. For example, the segments may be fed into the cable 100, blown into the cable 100, inserted into the cable 100, or otherwise incorporated. In yet other embodiments, multiple separators may be formed and the separators may be selectively fed into the cable 100 and cut during construction. In this regard, a separator 110 with varying materials may be formed. Indeed, a wide variety of suitable techniques may be utilized as desired to form and incorporate a separator 110 into a cable 100.

In certain embodiments, a separator 110 may be formed as a tape that includes both a dielectric layer (e.g., plastic, polyester, polyethylene, polypropylene, fluorinated ethylene propylene, polytetrafluoroethylene, polyimide, or some other polymer or dielectric material that does not ordinarily conduct electricity etc.) and an electrically conductive layer (e.g., copper, aluminum, silver, an alloy, etc.). A shield layer, such as shield layer 120, may be formed in a similar manner. In certain embodiments, a separate dielectric layer and electrically conductive layer may be bonded, adhered, or otherwise joined (e.g., glued, etc.) together to form the separator 110 (or shield). In other embodiments, electrically conductive material may be formed on a dielectric layer via any number of suitable techniques, such as the application of metallic ink or paint, liquid metal deposition, vapor deposition, welding, heat fusion, adherence of patches to the dielectric, or etching of patches from a metallic sheet. In certain embodiments, the conductive patches can be over-coated with an electrically insulating film, such as a polyester coating. Additionally, in certain embodiments, an electrically conductive layer may be sandwiched between two dielectric layers. In other embodiments, at least two electrically conductive layers may be combined with any number of suitable dielectric layers to form the separator 110 (or shield). For example, a four layer construction may include respective electrically conductive layers formed on either side of a first dielectric layer. A second dielectric layer may then be formed on one of the electrically conductive layers to provide insulation between the electrically conductive layer and the twisted pairs 105. Indeed, any number of suitable layers of material may be utilized to form a tape which may be used as the separator 110 or as a suitable shield layer.

As desired in various embodiments, the separator 110 may be formed in accordance with a wide variety of suitable dimensions, shapes, or designs. For example, a rod-shaped separator, a flat tape separator, a flat separator, an X-shaped or cross-shaped separator, a T-shaped separator, a Y-shaped separator, a J-shaped separator, an L-shaped separator, a diamond-shaped separator, a separator having any number of spokes extending from a central point, a separator having walls or channels with varying thicknesses, a separator having T-shaped members extending from a central point or center member, a separator including any number of suitable fins, and/or a wide variety of other shapes may be utilized. In certain embodiments, a dielectric material may be cast or molded into a desired shape. In other embodiments, a tape may be formed into a desired shape utilizing a wide variety of folding and/or shaping techniques. For example, a relatively flat tape separator may be formed into an X-shape or cross-shape as a result of being passed through one or more dies. In certain embodiments, a flat tape separator may be rolled into a relatively circular shape along the longitudinal direction and passed through a die that forms the separator into a desired shape, such as a cross-shape. A few non-limiting examples of separator shapes are described in greater detail below with reference to FIGS. 5A-5L As set forth above, a shield layer, such as shield layer 120, a separator 110, and/or various separator segments may include any number of patches of electrically conductive material. For example, a single electrically conductive or metallic patch may form a relatively continuous shield along a longitudinal length of a shield layer or a separator segment. Alternatively, a plurality of electrically conductive patches may be provided that are electrically isolated from one another to provide one or more shielding segments.

The electrically conductive patches may include any suitable substance or combination of substances, such as metal, a metallic substance (e.g., aluminum, copper, nickel, iron, silver, gold, a metallic alloy, etc.), or a combination of materials that readily transmits electricity. In certain embodiments, individual patches may be separated from one another so that each patch is electrically isolated from the other patches. This separation may be formed by gaps or spaces, such as gaps of dielectric material and/or air gaps (e.g., gaps between adjacent separator segments, etc.). The respective physical separations between the patches may impede the flow of electricity between adjacent patches. In certain embodiments, the electrically conductive patches may span fully across a separator segment (or shield layer) in the longitudinal direction. In other embodiments, a plurality of discontinuous patches may be incorporated into a separator segment (or shield layer). Additionally, in certain embodiments, the patches may span fully across a width of a separator 110 or shield layer. In other embodiments, patches may span around a circumference or other periphery of a separator 110. In yet other embodiments, at least portions of a separator segment may include relatively solid (or impregnated, blended, etc.) conductive material.

The electrically conductive patches or sections may also include a wide variety of suitable dimensions, for example, any suitable lengths in the longitudinal direction, any suitable gap lengths or spaces between adjacent patches, and/or any suitable thicknesses. Additionally, a plurality of patches may be formed in accordance with a pattern or in random fashion. As desired, the dimensions can be selected to provide electromagnetic shielding over a specific band of electromagnetic frequencies or above or below a designated frequency threshold. In certain embodiments, each patch may have a length of about one meter to about ten meters or greater (e.g., a length of up to 100 meters, etc.), although lengths of less than one meter (e.g., lengths of about 1.5 to about 2 inches, etc.) may be utilized. For example, the patches may have a length in a range of about one to ten meters and isolation spaces in a range of about one to five millimeters. In various embodiments, the patches may have a length of about 0.5, 0.75, 1.0, 1.5, 2.0, 2.5, 3.0, 3.5, 4.0, 4.5, or 5.0 meters or in a range between any two of these values; and the isolation spaces can have a length of about 0.5, 1.0, 1.5, 2.0, 2.5, 3.0, 3.5, or 4 millimeters or in a range between any two of these values. Additionally, in certain embodiments, the patches may be formed as first patches (e.g., first patches on a first side of a dielectric material), and second patches may be formed on an opposite side of the dielectric material (or on another dielectric material). For example, second patches may be formed to correspond with the gaps or isolation spaces between the first patches.

In certain embodiments, a dielectric portion of a tape (e.g., a tape that is formed into a desired shape to form a separator 110, a tape used to form an shield layer, etc.) may have a thickness of about 1 to about 5 mils (thousandths of an inch) or about 25 to about 125 microns. In the event that a non-tape separator is utilized, a dielectric portion or base portion of the separator may have any suitable dimensions, such as any suitable thickness, diameter, or circumference. Each electrically conductive patch may include a coating of metal having any desired thickness, such as a thickness of about 0.5 mils (about 13 microns) or greater. In many applications, signal performance benefits from a thickness that is greater than about 2 mils, for example in a range of about 2.0 to about 2.5 mils, about 2.0 to about 2.25 mils, about 2.25 to about 2.5 mils, about 2.5 to about 3.0 mils, or about 2.0 to about 3.0 mils. Indeed, with a thickness of less than about 1.5 mils, negative insertion loss characteristics may be present on the cable 100. In other embodiments, thicker portions of electrically conductive material may be utilized. For example, relatively solid portions of electrically conductive material may be positioned between dielectric ends to form a separator. A wide variety of other configurations including different thicknesses will also be appreciated.

In one example embodiment, patches of electrically conductive material may be between approximately two and approximately five meters in length. In another example embodiment, patches may be between approximately one and approximately three meters in length. For example, each patch may be at least two meters in length, and a relatively small isolation gap (e.g., 4 millimeters or less, about 1/16 of an inch, etc.) may be formed between adjacent patches. In the event that relatively long patches are utilized, such as patches that are approximately two meters in length or greater, a return loss spike for the cable 100 may be formed within the operating frequency of the cable 100. However, the amplitude of the return loss spike may satisfy electrical performance requirements for the cable 100 (i.e., fall within acceptable limits), thereby permitting higher signal frequencies to be supported by the cable 100. In the event that smaller patches are utilized (e.g., patches less than approximately one meter in length), a return loss spike may be shifted outside of the operating range of the cable 100.

Conventional thinking would suggest that a shielding configuration that provides a return loss spike in the operating band of a cable 100 should be avoided. However, the return loss spike is unexpectedly suppressed, thereby providing an acceptable cable with segment and gap dimensions that offer manufacturing advantages. In many circumstances, lengthening the patches may provide manufacturing advantages. With longer patches, the manufacturing process can be implemented with fewer patches, and tolerances for patch placement and/or for severing a separator into segments may be relaxed. Thus, fabrication of a separator 110 or shield layer can be simplified via using a smaller number of patches, with each having a length that is longer or extended. With longer patches, the length of each of the isolation spaces (e.g., dielectric gaps, gaps between separator segments, etc.) can also be increased since the resulting separator or shield has fewer isolation spaces through which radiation can pass. In other words, lengthening the patches leads to few isolation spaces transmitting interference to or from the conductor pairs 105; thus each isolation space can be bigger. Reducing the number of isolation spaces and increasing the length 87 of each space further relaxes manufacturing tolerances for patch placement.

In certain example embodiments, the patches may interact with signals flowing on the conductor pairs 105 in a collaborative manner involving multi-patch or patch-to-patch interaction. For example, an electric, magnetic, or electromagnetic field (or energy associated therewith) of one or more patches can accumulate with, affect, or interact with an electric, magnetic, or electromagnetic field (or energy associated therewith) of one or more other patches. Thus, energy and/or fields can accumulate or transfer between or among patches. Further, in certain embodiments, a standing wave can set up on the patches, and/or the patches can set up a standing wave impacting signals propagating through the conductor pairs 105. That is, the patches can resonate with one another or create a resonance impacting signal transmission on the conductor pairs 105.

In certain embodiments, a signal transmitting over a conductor pair 105 includes multiple frequencies or multiple frequency components. Each signal frequency produces an associated electromagnetic field that extends outward from the conductors of the pair 105 and that varies according to signal frequency. The varying electromagnetic field interacts with the patches. With patches having substantially uniform lengths and separated by substantially uniform isolation spaces, the patches can collectively interact with the electromagnetic fields in a manner that produces a cumulative interaction for certain signal frequencies. This cumulative interaction or resonance can, thereby, reflect specific signal frequencies more than other signal frequencies. This frequency-specific reflection can manifest itself as a peak or spike in return loss. In an alternative explanation, digital communication involves transmitting pulses or signals having sharp (rapidly increasing and decreasing) edges, often resembling a square wave when viewed on an instrument such as an oscilloscope. The signal edges or pulses include multiple signal frequencies. As the signals transmit over the cable 100, each signal frequency interacts with and may be slightly reflected by each patch edge encountered, each patch encountered, and/or each isolation space encountered. These slight reflections and/or interactions can accumulate for specific signal frequencies matching the physical dimensions of the pattern of patches and isolation spaces. For example, the patches may be disposed on a separator 110 and/or shield layer in a repeating pattern. Thus, the reflections add for signal frequencies that correlate with the period of the pattern of patches. This frequency-specific addition of signal reflection produces a return loss spike.

One option for addressing the return loss spike is to shorten the patches to move the spike to a frequency above the cable's operating frequency range. However, as discussed above, lengthening the patches is desirable from a manufacturing perspective. Another issue with shortening the patches and pushing the return loss spike towards a higher frequency stems from impairment of the cable's high-frequency performance. The higher signal frequencies can support faster data rates and can provide signals with sharper edges for beneficial signal detection. However, as a result of utilizing relatively large patches (e.g., about 2 meters or greater), an acceptable return loss spike may be positioned within the operating range of the cable 100. Accordingly, higher signal frequencies may be supported by the cable 100 without negatively impacting signal performance. Thus, increasing or lengthening the patch lengths beyond those of conventional cables benefits manufacturing while providing acceptable performance. The peak in return loss is surprisingly suppressed, and the cable 100 meets performance standards and network specifications.

In certain embodiments, the electrically conductive patches incorporated into a separator 110 and/or shield layer may have a spiral direction that is opposite the twist direction of the pairs 105. For example, the cable core and the four twisted pairs 105 may be collectively twisted about a longitudinal axis of the cable 100 in a common direction. The twist direction of the pairs 105 may be opposite the spiral direction of the patches. That is, if the core is twisted in a clockwise direction, then the patches may spiral in a counterclockwise direction. If the core is twisted in a counterclockwise direction, then the conductive patches may spiral in a clockwise direction. Thus, cable lay opposes the direction of the patch spiral. The opposite directions may provide an enhanced level of shielding performance. In other embodiments, the patches may have a spiral direction that is the same as the twist direction of the pairs 105. In yet other embodiments, patches formed on a separator 110 may have an opposite spiral direction than patches formed on a shield layer.

In certain embodiments, both a separator 110 and an external shield 120 may be incorporated into a cable. For example, a separator 110 may be positioned between a multitude of twisted pairs 105, and an external shield 120 may circumscribe the twisted pairs 105 (or a desired grouping of one or more twisted pairs). Further, both the separator 110 and the external shield 120 may include one or more patches of electrically conductive material. In this regard, the separator 110 may provide for shielding between the twisted pairs, and the external shield 120 may shield the twisted pairs from external signals. In certain embodiments, such as the example embodiment illustrated in FIG. 11 and described in greater detail below, the spaces between adjacent patches in the separator 110 may be dimensioned to align with corresponding spaces in the shield 120. As desired, the gaps may be dimensioned to be large enough to permit twisting and bending of the cable 100 while still permitting proper alignment of the separator 110 and shield 120. In other embodiments, patches on the shield 120 may be dimensioned to cover gaps or spaces in the separator 110.

As a result of utilizing both a separator 110 and shield 120, the performance of the cable 100 may be similar to a cable in which each of the twisted pairs 105 is individually shielded (i.e., a shielded twisted pair ("STP") cable). In other words, the cable 100 utilizing both a separator and an external shield may function as an alternative to conventional STP cables. However, the cable 100 may be easier to terminate by a technician. With a conventional STP cable, the insulation must be removed from each set of twisted pairs to facilitate termination. However, with a cable incorporating a shielding separator in combination with an external shield, each set of twisted pairs may be accessed by simply removing the external shield.

As desired in various embodiments, a wide variety of other materials may be incorporated into the cable 100. For example, as set forth above, the cable 100 may include any number of conductors, twisted pairs, optical fibers, and/or other transmission media. In certain embodiments, one or more tubes or other structures may be situated around various transmission media and/or groups of transmission media. Additionally, as desired, a cable may include a wide variety of strength members, swellable materials (e.g., aramid yarns, blown swellable fibers, etc.), insulating materials, dielectric materials, flame retardants, flame suppressants or extinguishants, gels, and/or other materials. The cable 100 illustrated in FIG. 1 is provided by way of example only. Embodiments of the disclosure contemplate a wide variety of other cables and cable constructions. These other cables may include more or less components than the cable 100 illustrated in FIG. 1. Additionally, certain components may have different dimensions and/or materials than the components illustrated in FIG. 1.

Figure 2:
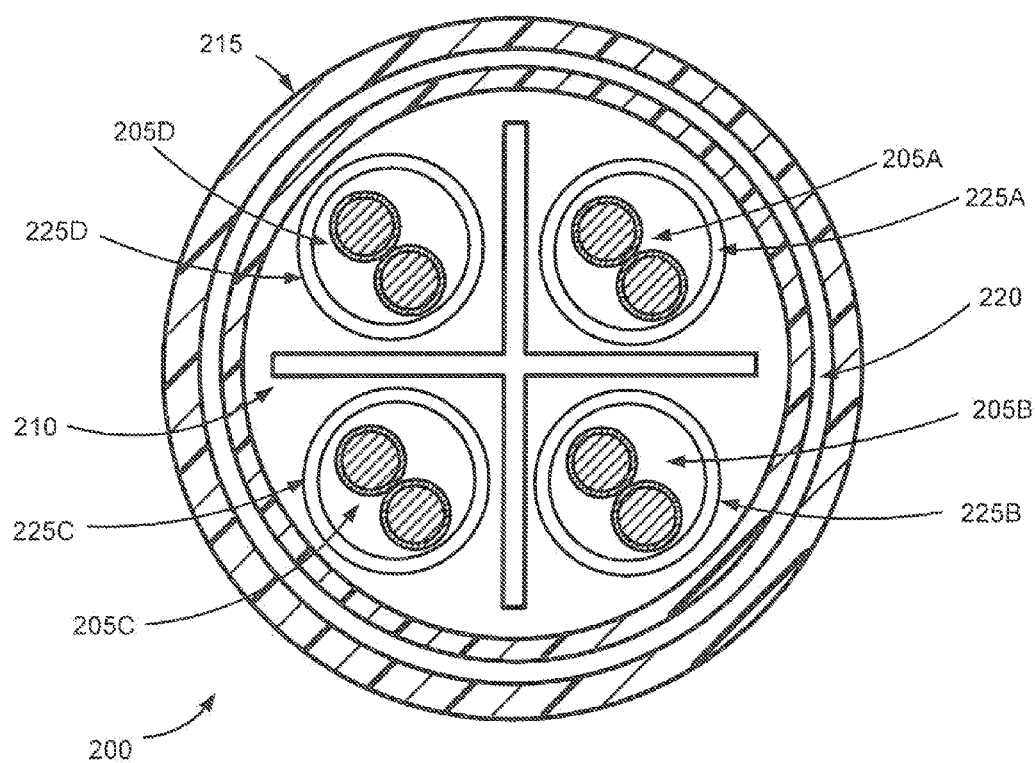
FIG. 2 is a cross-sectional view of another example cable including a separator, according to an illustrative embodiment of the disclosure.

FIG. 2 is a cross-sectional view of another example cable 200 including a separator, according to an illustrative embodiment of the disclosure. The cable 200 of FIG. 2 may include components that are similar to the cable 100 illustrated and described above with reference to FIG. 1. Accordingly, the cable 200 may include a plurality of twisted pairs 205A-D disposed in a cable core. A separator 210, which may be a non-continuous separator including a plurality of discrete portions or segments, may be disposed between at least two of the twisted pairs 205A-D and may function to orient and/or provide desired spacing between two or more of the twisted pairs 205A-D. In certain embodiments, the separator 210 may also include patches of electrically conductive material that provide shielding.

With continued reference to FIG. 2, an outer jacket 215 may enclose the internal components of the cable 200. Additionally, a shield layer 220 may be incorporated into the outer jacket 215. In certain embodiments, the shield layer 220 may be sandwiched between two other layers of outer jacket material, such as two dielectric layers. The layers of jacket material that sandwich the shield layer 220 may be formed of similar materials or, alternatively, of different materials. Further, a wide variety of suitable techniques may be utilized to bond or adhere the shield layer 220 to the other layers of the jacket 215. In other embodiments, electrically conductive material may be injected or inserted into the outer jacket 215. In yet other embodiments, the outer jacket 215 may be impregnated with electrically conductive material. In yet other embodiments, the cable 100 may not include an outer shield layer 220.

Additionally, as desired in certain embodiments, each of the twisted pairs 205A-D may be individually shielded. For example, shield layers 225A-D may respectively be wrapped or otherwise formed around each of the twisted pairs 205A-D. In other words, a first shield layer 225A may be formed around a first twisted pair 205A, a second shield layer 225B may be formed around a second twisted pair 205B, a third shield layer 225C may be formed around a third twisted pair 205C, and a fourth shield layer 225D may be formed around a fourth twisted pair 205D. In other embodiments, a portion or none of the twisted pairs may be individually shielded. Indeed, a wide variety of different shielding arrangements may be utilized in accordance with various embodiments of the disclosure.

Figure 3:
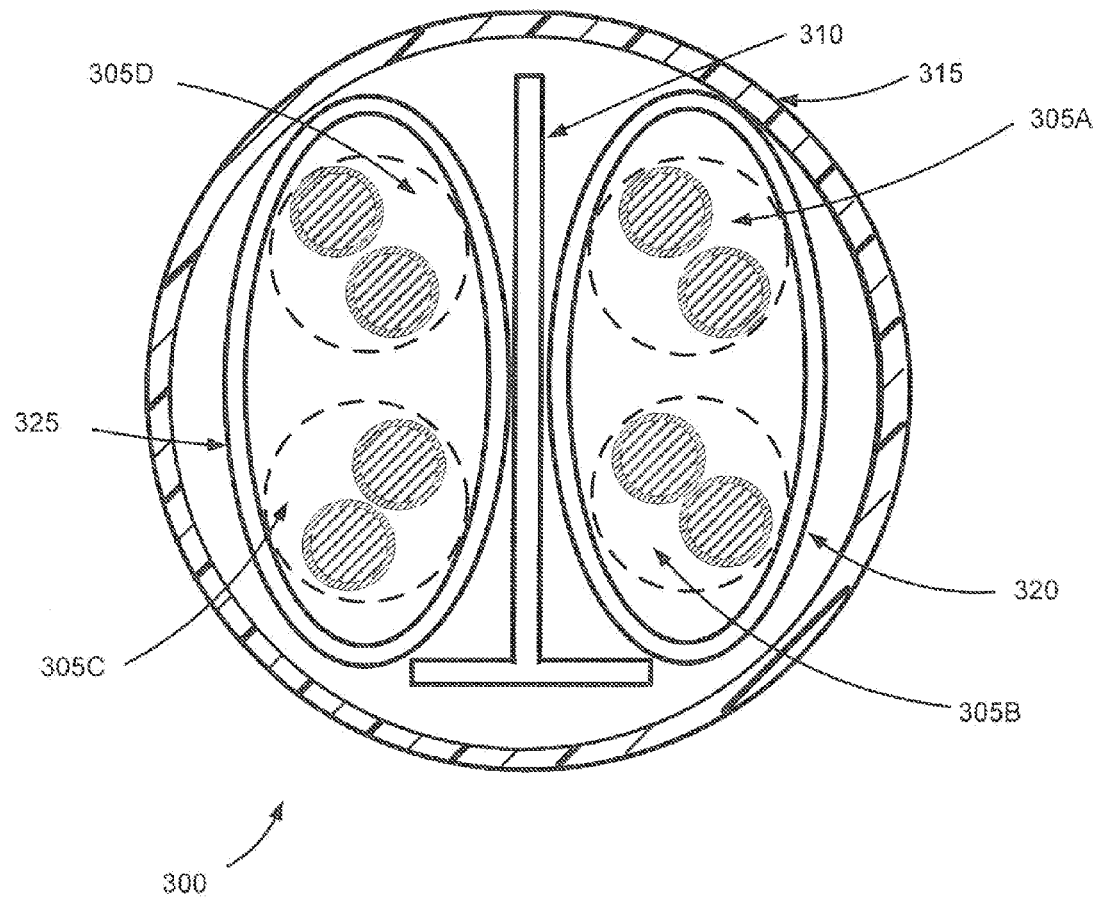
FIG. 3 is a cross-sectional view of another example cable including a separator, according to an illustrative embodiment of the disclosure.

FIG. 3 is a cross-sectional view of another example cable 300 including a separator, according to an illustrative embodiment of the disclosure. The cable 300 of FIG. 3 may include components that are similar to the cable 100 illustrated and described above with reference to FIG. 1. Accordingly, the cable 300 may include a plurality of twisted pairs 305A-D disposed in a cable core. A separator 310, which may be a non-continuous separator including a plurality of discrete portions or segments, may be disposed between at least two of the twisted pairs 305A-D and may function to orient and/or provide desired spacing between two or more of the twisted pairs 305A-D. In certain embodiments, the separator 310 may also include patches of electrically conductive material that provide shielding The separator 310 illustrated in FIG. 3 has a different construction than the separators 110, 210 illustrated in FIGS. 1 and 2. In particular, the separator 310 is a generally T-shaped separator that approximately bisects (or otherwise divides) the cable core and forms two channels along a longitudinal length of the cable 300 in which the twisted pairs 305A-D are disposed. For example, two twisted pairs 305A, 305B can be disposed in a first channel and the remaining two twisted pairs 305C, 305D can be disposed in a second channel. The T-shaped separator 310 illustrated in FIG. 3 is merely one example of an alternative separator shape. Additional separator shapes that may be utilized in various embodiments are described in greater detail below with reference to FIGS. 5A-5L.

With continued reference to FIG. 3, an outer jacket 315 may enclose the internal components of the cable 300. Additionally, any number of shield layers may be utilized to provide shielding for the twisted pairs 305A-D. For example, a first shield layer 320 may be wrapped or otherwise formed around two of the twisted pairs, such as the twisted pairs 305A, 305B disposed in the first channel. A second shield layer 325 may be wrapped or otherwise formed around other twisted pairs, such as twisted pairs 305C, 305D disposed in the second channel. In other words, shield layers may be provided for various groups of twisted pairs disposed within the cable core.

Similar to the cable 100 illustrated in FIG. 1, the cables 200, 300 illustrated in FIGS. 2 and 3 are provided by way of example only. Embodiments of the disclosure contemplate a wide variety of other cables and cable constructions. These other cables may include more or less components than the cables 200, 300 illustrated in FIGS. 2 and 3. For example, other cables may include alternative shielding arrangements and/or different types of separators or fillers. Additionally, certain components may have different dimensions and/or materials than the components illustrated in FIGS. 2 and 3.

Figure 4A:
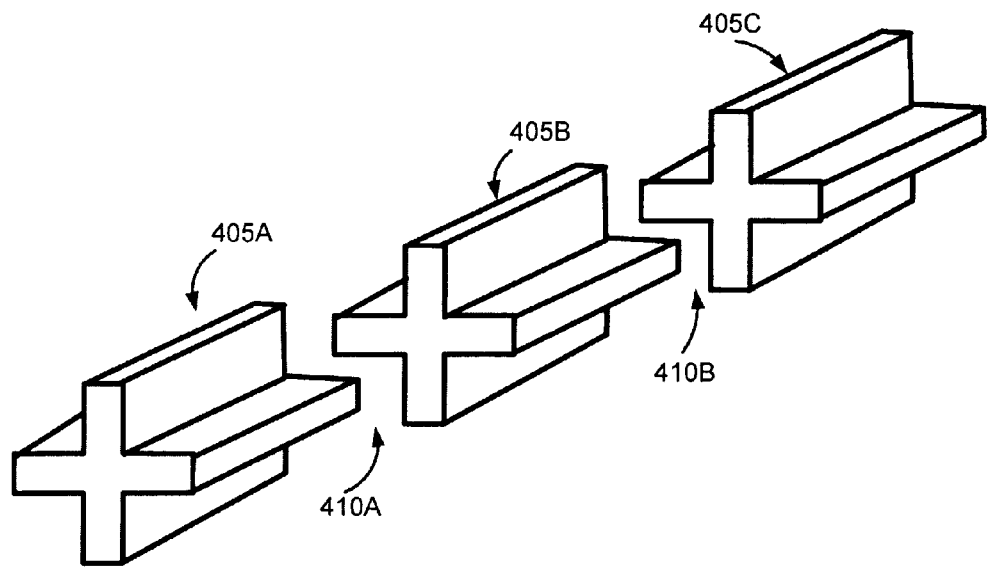
FIGS. 4A-4B are perspective views of example separators that may be incorporated into a cable, according to illustrative embodiments of the disclosure.

As set forth in greater detail above, a wide variety of different types of separators or fillers may be incorporated into cables as desired in various embodiments. FIG. 4A is a perspective view of an example separator 400 that may be incorporated into a cable, such as the cable 100 illustrated in FIG. 1 or the cable 200 illustrated in FIG. 2. According to an aspect of the disclosure, the separator 400 may be a non-continuous, separated, segmented, or severed in a longitudinal direction such that discrete sections or portions of the separator 400 are arranged longitudinally (e.g., end to end) along a length of a cable. A few example discrete separator segments 405A, 405B, 405C are illustrated in FIG. 4A.

In certain embodiments, gaps or spaces may be present between one or more pairs of adjacent separator segments 405A-C along a longitudinal direction. For example, a first gap 410A may be present between a first separator segment 405A and a second separator segment 405B. Similarly, a second gap 410B may be present between the second separator segment 405B and a third separator segment 405C. In other embodiments, adjacent segments of the separator 400 may contact one another along shared longitudinal edges. In yet other embodiments, certain separator segments may contact one another while gaps are present between other separator segments.

Figure 4B:
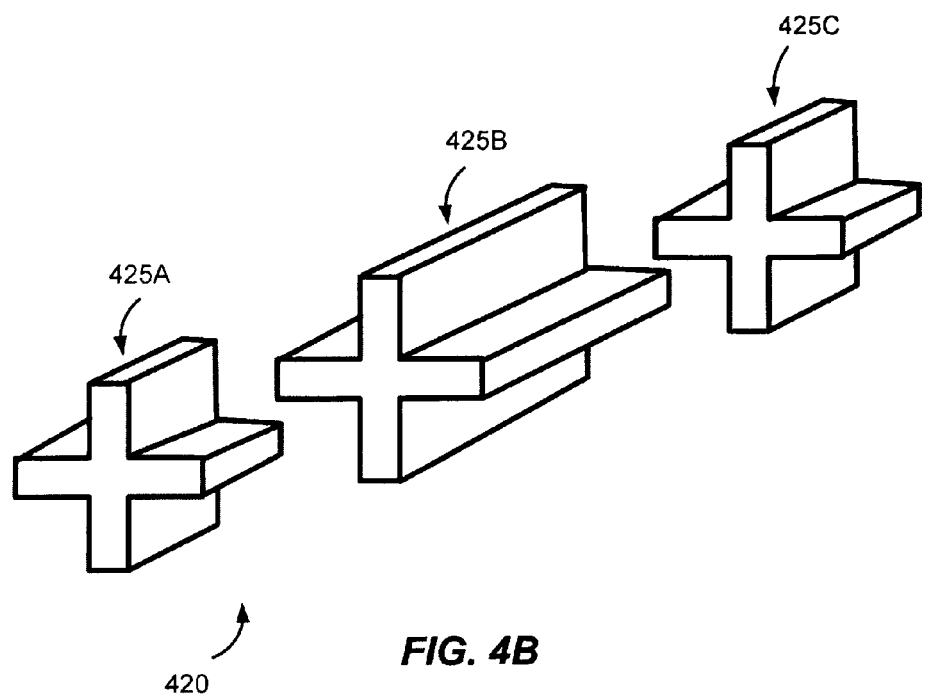

As set forth in greater detail above with reference to the separator 100 of FIG. 1, the various segments 405A-C of the separator 400 may include a wide variety of different lengths and/or sizes. As desired, various segments 405A-C may have common dimensions or, alternatively, certain segments may have varying dimensions (e.g., dimensions that vary in accordance with a pattern, dimensions that vary randomly, etc.). For example, as illustrated in FIG. 4B, a separator 420 may be formed with a plurality of segments 425A-C, and at least two of the segments (e.g., segments 425A and 425B) may have different lengths. Additionally, a wide variety of gap sizes between adjacent portions of the separator 400 may be utilized as desired in various embodiments. Gaps sizes may be approximately constant along a length of the cable or, alternatively, the sizes of gaps may be varied (e.g., varied in accordance with a pattern, varied at random, etc.). In certain embodiments, gaps may be small enough to prevent twisted pairs from contacting each other in the interstitial spaces between adjacent segments of the separator 400. Further, the separator 400 may include a wide variety of different dimensions, shapes, and/or designs. As shown, the separator 400 may have an X-shape or cross-shape; however, a wide variety of other shapes may be utilized.

The segments 405A-C of the separator 400 may be formed from any number of suitable materials and/or combination of materials. For example, the separator segments 405A-C can include paper, metals, alloys, various plastics, polyolefins (e.g., polyethylene, polypropylene, etc.), fluoropolymers (e.g., fluorinated ethylene propylene, etc.), etc. polyurethane, flame retardant polyurethane, PVC, polyethylene, FEP, ethylene chlorotrifluoroethlyene ("ECTFE"), one or more fluoropolymers, neoprene, cholorosulphonated polyethylene, flame retardant PVC, low temperature oil resistant PVC, polyolefin, flexible PVC, low smoke zero halogen ("LSZH") material, various copolymers, or any other suitable materials or combination of materials. As desired, the separator segments 405A-C may be filled, unfilled, foamed, un-foamed, homogeneous, or inhomogeneous and may or may not include additives. In certain embodiments, various fire-retardant additives, smoke suppressants, water blocking materials, superabsorbent fibers, and/or other additives may be incorporated into one or more segments 405A-C. Additionally, in certain embodiments, electrically conductive material may be incorporated into one or more segments 405A-C. In certain embodiments, the segments 405A-C may be formed from one or more materials which provide a relatively low loss tangent. Additionally, as desired, the materials used to form the segments 405A-C may be foamed to improve overall attenuation.

In certain embodiments, each segment 405A-C of the separator 400 may be formed from similar materials. In other embodiments, the separator 400 may make use of alternating materials in adjacent segments (whether or not a gap is formed between adjacent segments). For example, a first segment 405A may be formed from a first set of one or more materials, and a second segment 405B may be formed from a second set of one or more materials. As one example, a relatively flexible material may be utilized in every other segment of a separator 400. As another example, relatively expensive flame retardant material may be selectively incorporated into desired segments of the separator 400. In this regard, material costs may be reduced while still providing adequate flame retardant qualities.

A wide variety of suitable methods and/or techniques may be utilized as desired to incorporate a separator 400 into a cable. For example, during construction of the cable, the separator 400 may be spooled from a reel (or multiple reels if alternating materials or used) and inserted (i.e., pulled into, etc.) into a cable. The separator 400 may be cut to a desired length (or desired lengths) during insertion to form a portion or segment of the separator 400. A desired, a gap or space may then be permitted to form prior to spooling of additional material from the reel to insert another portion or segment of the separator 400. As another example, segments of the separator 400 may be cut and blown or injected into the cable during cable construction.

As a result of providing a discontinuous separator 400 within a cable, the flexibility of the cable may be enhanced. For example, gaps or other discontinuities between adjacent portions of the separator 400 may facilitate easier bending of the cable. The enhanced flexibility may assist in installation and handling of the cable. Additionally, provision of a discontinuous separator 400 may reduce the cost of material incorporated into the cable, and therefore, may reduce the overall cost of the cable. Further, in certain embodiments, provision of a discontinuous separator 400 may reduce an amount of smoke produced during a fire and/or may reduce flame spreading. For example, if a separator 400 includes materials that produce smoke, a discontinuous separator 400 may produce relatively less smoke due to including less material. As another example, gaps in a separator 400 may limit the ability of a fire to spread via the separation filler.

Although discontinuous separators are described above, a wide variety of other types of separators may be utilized in various embodiments. For example, in certain embodiments, a relatively continuous separator may make use of alternating materials in adjacent portions. For example, a first segment of the separator may be formed from a first material, and a second segment of separator may be formed from a second material. As one example, a first portion may be formed from a metal material while a second portion is formed from a plastic material. As another example, a first segment may be formed from a plastic material while a second segment is formed from a paper material. As another example, alternating strength segments and flexibility segments may be provided. As yet other examples, at least three different materials may be used to form a separator. Each component of a multi-component separator may include a wide variety of lengths and/or other dimensions, which may be approximately equal or which may vary. For example, one foot sections of plastic and paper material may be alternated. Other lengths and/or dimensions may be utilized in accordance with various embodiments. In other embodiments, certain portions of the separator may overlap one another.

In other embodiments, a separator may be provided as a multi-layer separator. During construction of a cable, the multi-layer separator may be inserted into the cable, and at least one layer (or a portion of the separator) may be removed from desired sections of the separator. In this regard, a separator may include thinner and thicker portions along a length of the cable. The thinner portions may enhance the flexibility of the cable. In yet other embodiments, a multi-layer separator may be utilized in conjunction with other separator components and/or with the use of gaps or spaces between adjacent portions of a discontinuous separator. In other example embodiments, a separator or any number of desired portions of a separator (e.g., a continuous separator, a discontinuous separator, etc.) may be scored or partially cut at one or more locations. The scoring may enhance the flexibility of the separator, and therefore, the flexibility of a cable in which the separator is incorporated. Indeed, a wide variety of different constructions may be utilized to form a separator.

As set forth above, a separator may be formed utilizing a wide variety of different cross-sectional shapes, dimensions, and/or forms. FIGS. 5A-5L illustrate cross-sectional views of example separators that may be utilized in accordance with various embodiments of the disclosure. In certain embodiments, a separator may be molded or formed from dielectric material and, as desired, electrically conductive material may be combined (e.g., deposited onto, incorporated into, adhered to, etc.) with the dielectric material. In other embodiments, a dielectric tape, which may include electrically conductive material, may be formed into a desired shape to be utilized as a separator.

Figure 5A:
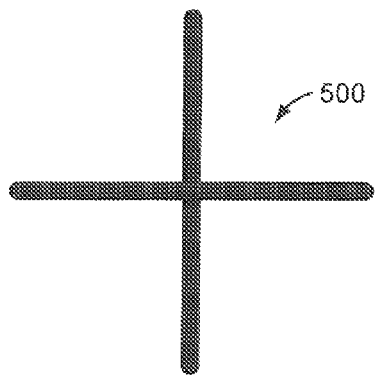
FIGS. 5A-5L illustrate cross-sectional views of example separators that may be utilized in accordance with various embodiments of the disclosure.

FIG. 5A illustrates an example separator 500 having a cross, plus, or X-shape. The separator 500 may form four channels, and a respective twisted pair may be positioned within each channel. As shown, the separator 500 includes four fins extending from a central point. However, as desired in other embodiments, one or more of the fins may be offset from the central point. Additionally, as desired, one or more extensions (not shown) may extend laterally from the ends of one or more of the fins. The extensions may be configured to contact the outer jacket of a cable (or any intermediate shielding or other layer) and may assist in holding the separator 500 in place.

Figure 5B:
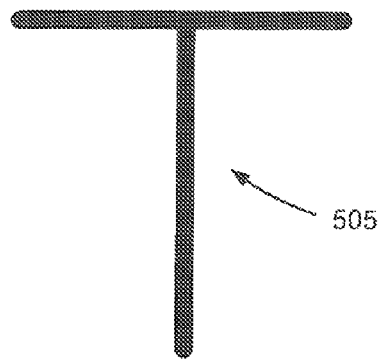

FIG. 5B illustrates an example separator 505 having a T-shape. The separator 505 may include a first portion or segment that bisects (or otherwise divides) a cable core, thereby forming two channels in which twisted pairs are disposed. For example, two twisted pairs can be disposed in a first channel and an additional two twisted pairs can be disposed in a second channel. Additionally, the separator 505 may include a second portion connected at one end of the first portion at an approximately 90 degree angle. In certain embodiments, the first portion may contact the second portion at an approximate midpoint of the second portion. In other embodiments, the connection may be offset from a midpoint of the second portion. Additionally, as desired, the first portion may extend through the second portion any desired distance. The second portion may be configured to contact the outer jacket of a cable (or any intermediate shielding or other layer) and may assist in holding the separator 505 in place.

Figure 5C:
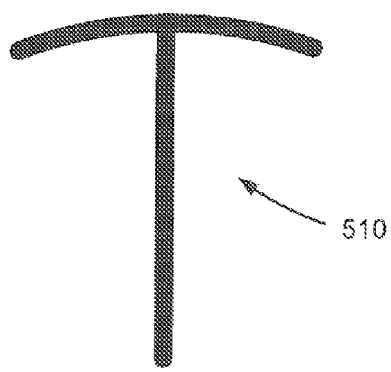
Figure 5D:
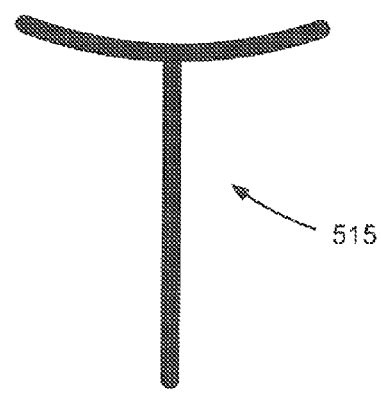

FIG. 5C illustrates an example separator 510 having a first segment that bisects (or otherwise divides) a cable core and a second segment having a concave shape. Similar to the separator 505 illustrated in FIG. 5B, the first segment may form two channels in which twisted pairs are disposed. The second segment may be connected to the first segment, and the second segment may be configured to contact the outer jacket of a cable (or an intermediate layer) in order to hold the separator 510 in place. FIG. 5D illustrates another example separator 515 similar to the separators 505, 510 illustrated in FIGS. 5B and 5C. However, the separator 515 of FIG. 5D has a second portion with a convex shape. The convex second portion may be configured to hold the separator 515 in place as it contacts an outer jacket (or intermediate layer) of a cable. Additionally, the convex second portion may initially create a separation or gap between portions of the separator 515 and the outer jacket. The separation or gap may be removed as the separator 515 is deformed during assembly (e.g., application of the outer jacket), storage, and/or installation of the cable, and the deformation may result in a tighter bond being formed between the separator 515 and outer jacket.

Figure 5E:
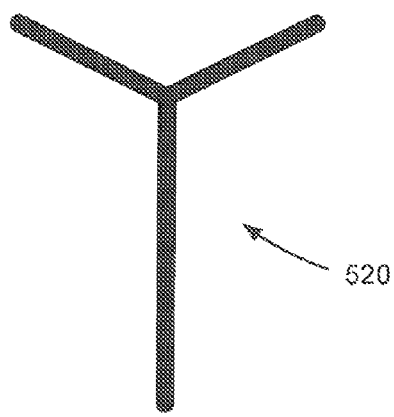

FIG. 5E illustrates an example separator 520 having a Y-shape. The separator 520 may include a first portion that bisects (or otherwise divides) a cable core, thereby forming two channels in which twisted pairs can be positioned. A second portion and a third portion may extend from one end (or from another desired point) of the first portion. The second and third portions may each extend at a desired angle in order to form the Y-shape separator 520. The opposite ends of the second and third portions may contact the outer jacket (or intermediate layer) of a cable, thereby assisting in holding the separator 520 in place. Additionally, the second and third portions may be deformed in a similar manner as that described above for the separator 515 of FIG. 5D.

Figure 5F:
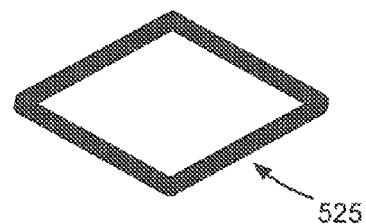
Figure 5G:
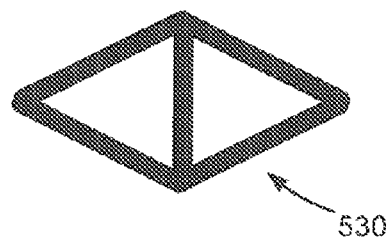

FIG. 5F illustrates an example separator 525 having a diamond shape. In certain embodiments, the separator 525 may be formed as a relatively solid separator. In other embodiments, the separator 525 may include one or more internal cavities filled with a gel or foam. In other embodiments, as illustrated by the separator 530 depicted in FIG. 5G, the separator 525 may include one or more ribs or support segments that assist the diamond in maintaining its shape. As desired, a diamond shape separator may include any number of gaps, holes, or spaces that may function to reduce the amount of material utilized to form the separator 525 and/or which may provide channels for additional components of a cable, such as a drain wire, an optical fiber, etc.

Figure 5H:
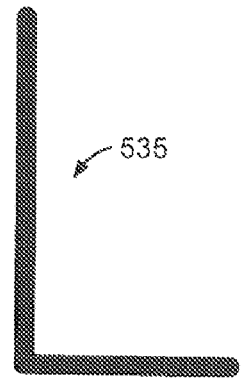

FIG. 5H illustrates an example separator 535 having an L-shape. The separator 535 may include a first portion or segment that bisects (or otherwise divides) a cable core, thereby forming two channels in which twisted pairs are disposed. Additionally, the separator 535 may include a second portion connected at one end of the first portion at an approximately 90 degree angle. The first portion may contact the second portion at one end of the second portion. The second portion may be configured to contact the outer jacket of a cable (or intermediate layer) and may assist in holding the separator 535 in place.

Figure 5I:
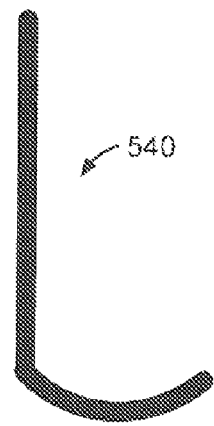

FIG. 5I illustrates an example separator 540 having a J-shape. The separator 540 illustrated in FIG. 5I is a variation of the L-shaped separator 535 illustrated in FIG. 2I; however, the second portion may have a concave curve configured to contact an outer jacket (or intermediate layer). As an alternative to a J-shape separator, a second portion may have a convex shape configured to contact an outer jacket (or intermediate layer) of a cable.

Figure 5J:
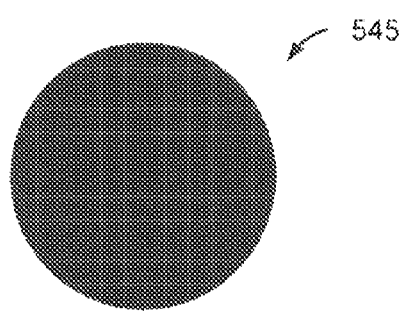
Figure 5K:
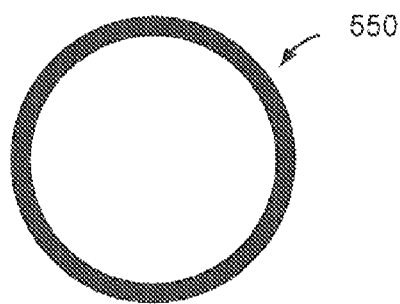

FIG. 5J illustrates an example separator 545 having a rod shape. The separator 545 may have a circular or elliptical cross-section. In certain embodiments, the separator 545 may be formed as a relatively solid separator. In other embodiments, as illustrated by the separator 550 illustrated in FIG. 5K, one or more internal cavities may be provided. As desired, these cavities may provide channels for additional cable components (e.g., a drain wire, an optical fiber, etc.) and/or a filling compound (e.g., gel, foam, etc.). In other embodiments, as one or more internal ribs or support segments may be provided inside an internal cavity to assist a separator in maintaining its shape and/or to provide multiple internal cavities.

Figure 5L:
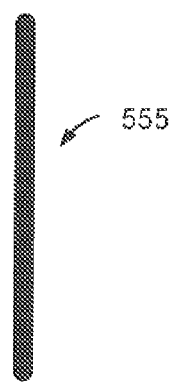

FIG. 5L illustrates an example separator 555 having a relatively flat shape. The separator 555 may be positioned between two or more of the twisted pairs of a cable. For example, the separator 555 may be positioned within the cable in order to bisect (or otherwise divide) a cable core, and two twisted pairs may be disposed on either side of the separator 555. In certain embodiments, the separator 555 may be a tape separator. In other embodiments, the separator 555 may be formed from any number of other materials. A wide variety of other dimensions and shapes may be utilized as desired to form a separator in accordance with embodiments of the disclosure. Additionally, as desired, twisted pairs may be adhered to a separator in order to maintain a desired separation distance.

Figure 6A:
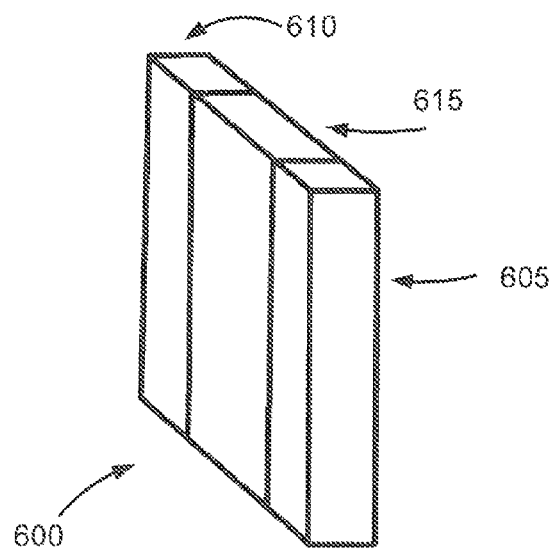
FIGS. 6A-6B illustrate perspective views of example separator segments that may be utilized in accordance with various embodiments of the disclosure.
Figure 6B:
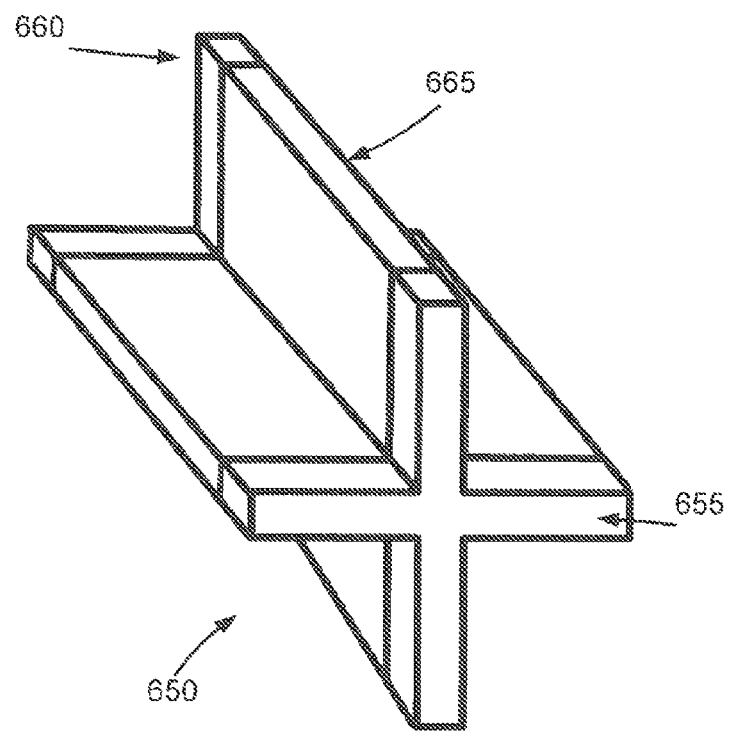

FIGS. 6A-6B illustrate perspective views of example separator segments 600, 650 that may be utilized in accordance with various embodiments of the disclosure. In certain embodiments, the separator segments illustrated in FIGS. 6A and 6B may be incorporated into a discontinuous separator. For example, a plurality of segments may be positioned adjacent to one another along a longitudinal length of a cable in order to form a separator.

Turning first to FIG. 6A, a first example separator segment 600 is illustrated. The segment 600 may be a relatively flat segment including a first end portion 605 formed of a dielectric or relatively nonconductive material and a second end portion 610 formed of a dielectric or relatively nonconductive material. Electrically conductive material 615 that provides may be positioned between the first and second end portions 605, 610. As a result of positioning the electrically conductive material 615 between two dielectric ends 605, 610, electrical discontinuity may be maintained along a length of a separator incorporating multiple separator segments 600. In the event that adjacent segments of a separator contact one another within a cable, the electrically conductive material incorporated into a first segment will not contact the electrically conductive material incorporated into a second segment. In other embodiments, one of the dielectric ends 605, 610 may be omitted from the separator segment 600 and electrical discontinuity may still be maintained in a separator.

In certain embodiments, the electrically conductive material 615 may be relatively solid material positioned between the dielectric ends 605, 610. In other embodiments, the electrically conductive material 615 may include one or more patches of electrically conductive material formed on or adhered to a dielectric substrate, which may be integral with the ends 605, 610. In yet other embodiments, the electrically conductive material 615 may be embedded into a dielectric base, impregnated into a dielectric base, or sandwiched between multiple dielectric layers. Indeed, a wide variety of different techniques may be utilized to incorporate the electrically conductive material 615 into a separator segment.

With reference to FIG. 6B, a second example separator segment 650 having a cross-shape or X-shape is illustrated. The construction of the segment 650 illustrated in FIG. 6B may be similar to the construction of the segment 600 illustrated in FIG. 6A and described above. Accordingly, the segment 650 may include a first dielectric end 655 and a second dielectric end 660 longitudinally opposite the first end 655 along a length of the segment 650. Electrically conductive material 665 may then be positioned between the first and second dielectric ends 655, 660. As desired, one of the dielectric ends 655, 660 may be omitted in certain embodiments. A wide variety of other separator segment shapes and/or dimensions may be utilized as desired in various embodiments, and the constructions illustrated in FIGS. 6A and 6B are provided by way of example only.

Figure 7A:
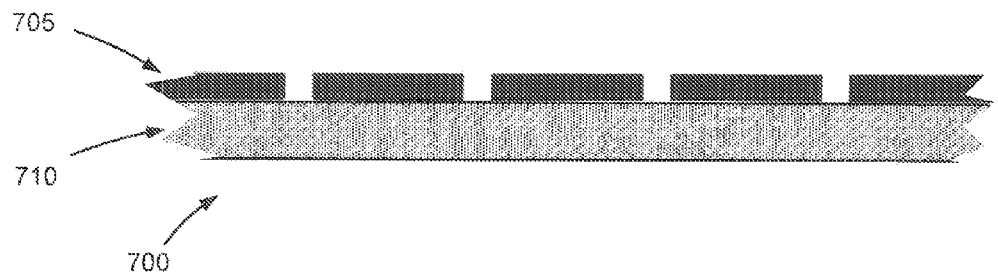
FIGS. 7A-7C illustrate example constructions that may be utilized to form a separator and/or a shield layer in accordance with various embodiments of the disclosure.
Figure 7B:
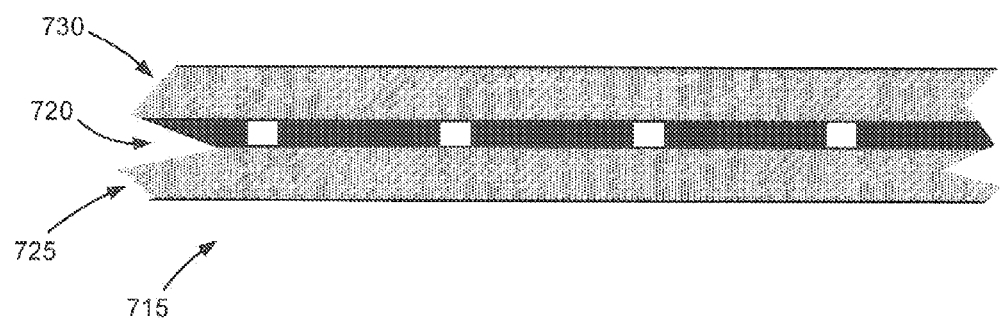
Figure 7C:
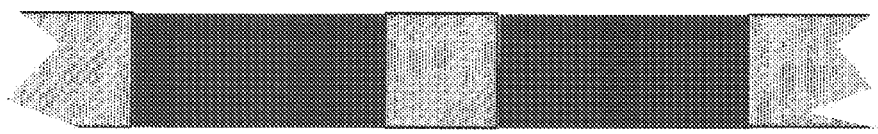

FIGS. 7A-7C illustrate example constructions that may be utilized to form a separator and/or a shield layer in accordance with various embodiments of the disclosure. With reference to FIG. 7A, a first example construction 700 that may be utilized to form a separator and/or a shield layer is illustrated. In certain embodiments, the construction 700 may be a tape including a dielectric layer 705, and an electrically conductive layer 710 may be formed or disposed on one side of the dielectric layer 705. The electrically conductive layer 710 may include any number of patches of electrically conductive material in order to form either a continuous or a discontinuous shield layer. In other embodiments, the construction 700 may include a non-tape construction with a base layer and electrically conductive material formed on the base layer.

FIG. 7B illustrates another example construction 715 in which an electrically conductive layer 720 is sandwiched between two dielectric layers 725, 730. FIG. 7C illustrate another example construction 735 for a separator or shield layer in which alternating sections of dielectric and electrically conductive material are provided. For example, a first dielectric portion 740 may be provided; a first electrically conductive portion 745 may be adhered, bonded, or otherwise connected to one end of the first dielectric portion 740; and a second dielectric portion 750 may be adhered, bonded, or otherwise connected to the other end of the first electrically conductive portion 745. As desired, additional electrically conductive portions and dielectric portions, such as a second electrically conductive portion 755 and a third dielectric portion 760, may also be provided. A wide variety of other constructions may be utilized as desired to form a separator or shield layer in accordance with various embodiments of the disclosure. Indeed, any number of dielectric and electrically conductive layers may be utilized. The tapes 300, 315 illustrated in FIGS. 3A and 3B are provided by way of example only. Additionally, although illustrated as tape separators, other types of separators may be formed that include dielectric material with metallic patches.

Figure 8A:
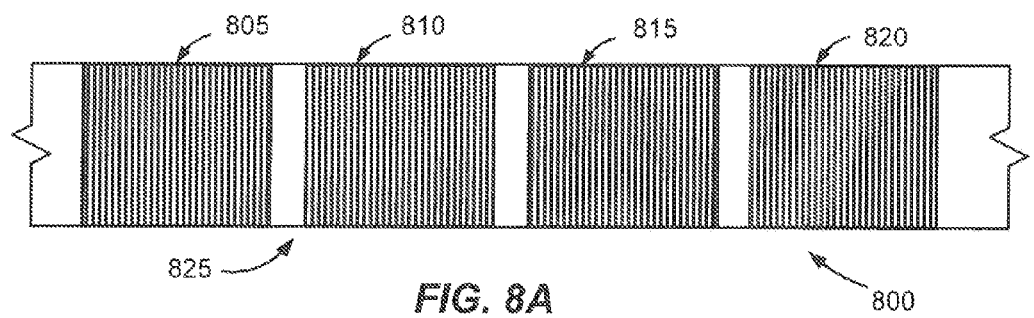
FIGS. 8A-8D illustrate example configurations for electrically conductive material that may be utilized to form a separator, a separator section, or a shield layer in accordance with various embodiments of the disclosure.

As desired, patches of electrically conductive material incorporated into a separator, a separator segment, or a shield layer may have a wide variety of different shapes and/or orientations. FIGS. 8A-8D illustrate example configurations for electrically conductive material or patches that may be utilized in various embodiments. With reference to FIG. 8A, a top level (or bottom level) view of a first example separator 800 (or separator segment or shield layer) is illustrated. Any number of rectangular patches of electrically conductive material, such as patches 805, 810, 815, 820, may be formed on a dielectric material 825. As desired in various embodiments, the patches 805-820 may include any desired lengths (e.g., approximately 2 meters, etc.), and any desired gap or separation distance may be provided between adjacent patches. In certain embodiments, the patches may be formed in accordance with a repeating pattern having a definite step or period.

Figure 8B:
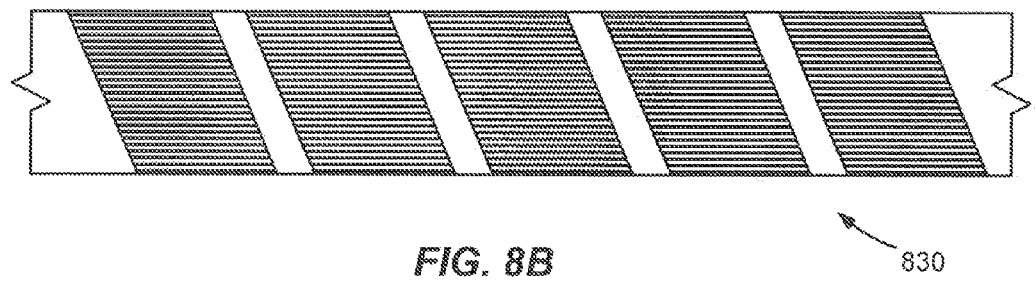

FIG. 8B illustrates a top level (or bottom level) view of a second example separator 830 (or separator segment or shield layer). The separator 830 may include any number of electrically conductive patches having the shape of a parallelogram. In other words, the patches may be formed at an angle along a length of the separator 830. As shown, the patches may be formed at an acute angle with respect to the width dimension of the separator 830. In certain embodiments, the acute angle facilitates manufacturing and enhances patch-to-substrate adhesion.

For shield layers that are wrapped around one or more twisted pairs (or multi-layer separators), the acute angle may also facilitate the covering of opposing isolating spaces or gaps. For example, the acute angle results in the isolating spaces being oriented at a non-perpendicular angle with respect to the pairs and the longitudinal axis of a cable. If any manufacturing issue results in part of the isolating spaces not being completely covered (e.g., by a conductive patch on an opposite shield side), such an open area will likewise be oriented at a non-perpendicular angle with respect to the pairs. Such an opening will therefore spiral about the pairs, rather than circumscribing a single longitudinal location of the cable. Such a spiraling opening is believed to have a lesser impact on shielding than would an opening circumscribing a single longitudinal location. In other words, an inadvertent opening that spirals would allow less unwanted transmission of electromagnetic interference than a non-spiraling opening. In certain embodiments, benefit is achieved when the acute angle is about 45 degrees or less. In other embodiments, benefit is achieved when the acute angle is about 35 degrees or less, about 30 degrees or less, about 25 degrees or less, about 20 degrees or less, or about 15 degrees or less. In other embodiments, benefit is achieved when the acute angle is between about 12 and 40 degrees. In certain embodiments, the acute angle may be in a range between any two of the degree values provided in this paragraph.

Figure 8C:
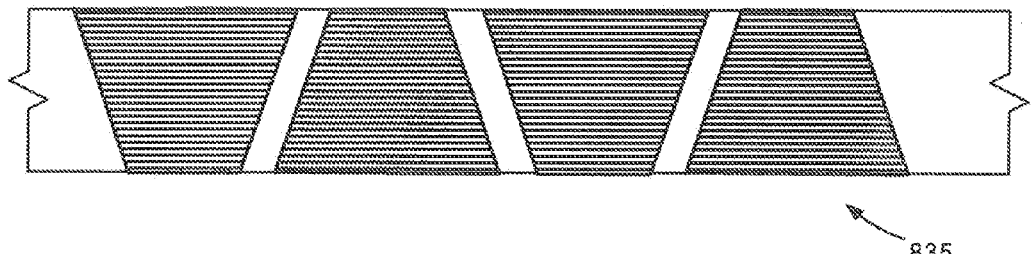
Figure 8D:
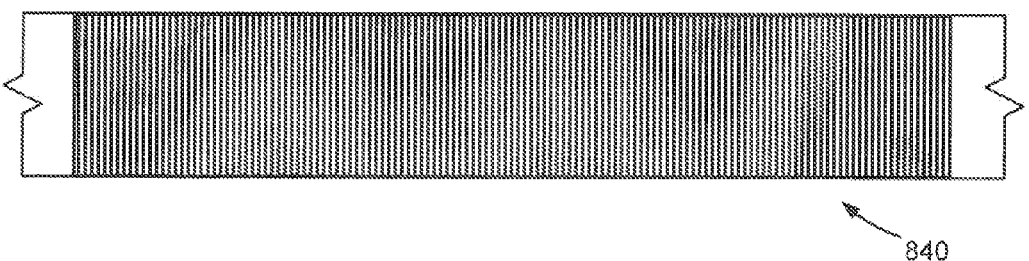

FIG. 8C illustrates a top level (or bottom level) view of a third example separator 835 (or separator segment or shield layer). The separator 835 may include any number of metallic patches having a trapezoidal shape. In certain embodiments, the orientation of adjacent trapezoidal patches may alternate. For example, a first patch may be formed as an upright trapezoid and a second patch may be formed as an upside down trapezoid. Similar to the patch pattern illustrated in FIG. 8B, the trapezoidal patches may provide manufacturing and/or shielding benefits. FIG. 8D illustrates a top level (or bottom level) view of a fourth example separator segment 840 (or shield layer). The separator segment 840 may include a relatively continuous patch of electrically conductive material running along a longitudinal length of the separator 840. As desired, a dielectric end may be positioned at one end of the segment 840. With a shield layer, a relatively continuous shield may be performed and, as desired, the electrically conductive material may be grounded at either end when a cable incorporating the shield layer is installed.

Figure 9A:
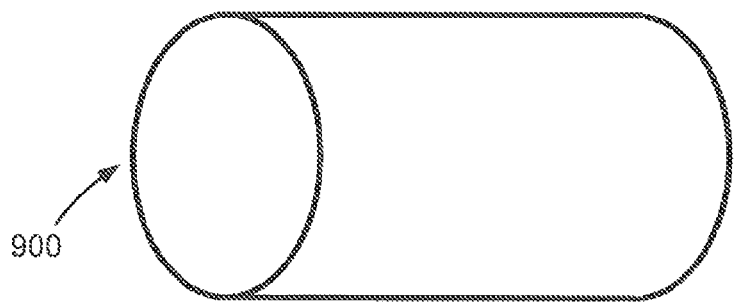
FIGS. 9A-9C illustrate an example die that may be utilized to form a separator in accordance with an example embodiment of the disclosure.
Figure 9B:
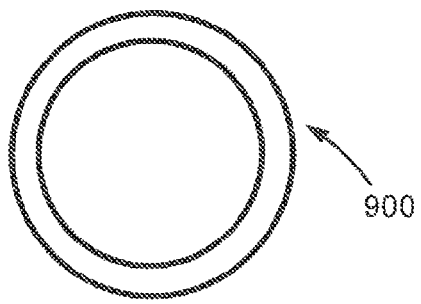
Figure 9C:
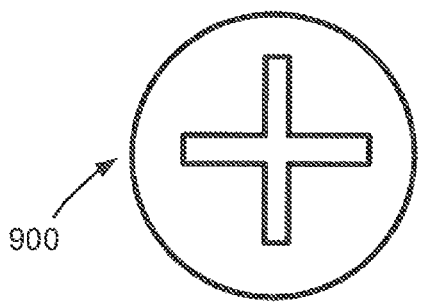

FIGS. 9A-9C illustrate several views an example die 900 that may be utilized to form a separator in accordance with an example embodiment of the disclosure, such as the separator 110 illustrated in FIG. 1. More particularly, FIG. 9A illustrates a perspective view of the die 900, FIG. 9B illustrates a view of a first end of the die 900, and FIG. 9C illustrates a view of a second end of the die 900. The illustrated die 900 may be configured to form a tape into a separator having a cross or "+" orientation. In operation, a tape, such as a tape including a dielectric material with electrically conductive patches formed thereon, may be fed through the die 900 and formed into a cross orientation. In certain embodiments, the tape may be rolled into a circular configuration prior to being fed through the die 900. In other embodiments, the die 900 may include one or more grooves and/or edges that roll the tape into a circular configuration as it is passed through the die 900. As the tape is fed through the die 900, the die 900 will compress the tape into a desired shape. In other words, the indentions on the interior of the die 900 will compress the tape at four different points in order to form a desired cross shape.

The die 900 illustrated in FIGS. 9A-9C is merely one example of a die that may be utilized to form a tape into a desired separator shape. A wide variety of other dies may be utilized in other embodiments to form a separator from a tape or any other suitable materials. These dies may be utilized to form any desired structure and/or separators with any desired dimensions or shapes, such as T-shaped separators, L-shaped separators, etc. Additionally, in certain embodiments, a plurality of dies may be utilized to form a separator. In other embodiments, a separator may be formed via an extrusion process. For example, a liquid material may be extruded onto a base (e.g., a strength member or rod) and the extruded material may be passed through one or more dies prior to cooling in order to form a separator. Electrically conductive material may then be applied, affixed, adhered, or inserted into to the separator. Alternatively, the separator may be extruded or formed over electrically conductive material. Indeed, a wide variety of different techniques may be utilized to form a separator.

Figure 10:
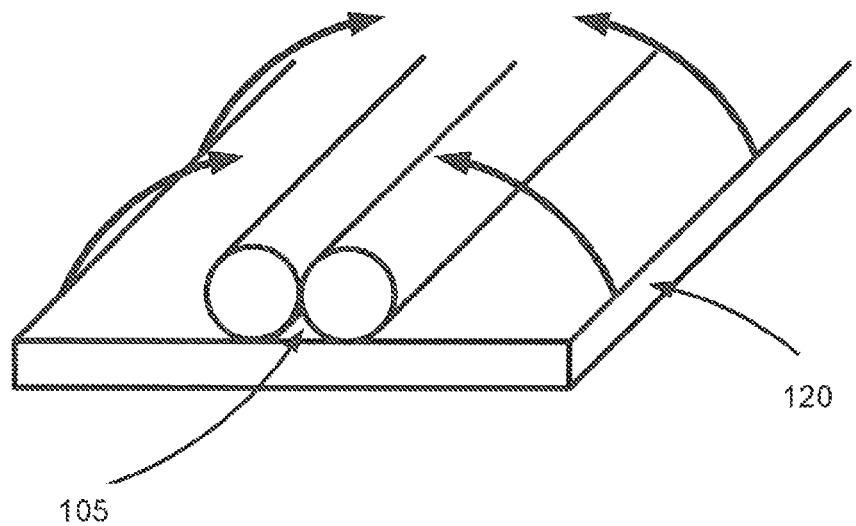
FIG. 10 illustrates an example technique for wrapping one or more twisted pairs with a shield layer in accordance with certain embodiments of the disclosure.

As set forth above, certain embodiments of the disclosure may utilize one or more shield layers. A shield layer may be wrapped around any number of twisted pairs and/or other components incorporated into a cable. FIG. 10 illustrates an example technique for wrapping one or more twisted pairs, such as twisted pairs 105 illustrated in FIG. 1, with a shield layer (illustrated as shield layer 120) in accordance with certain embodiments of the disclosure. With reference to FIG. 10, one or more twisted pairs may be positioned adjacent to a shield layer 120, such as a tape shield layer including discontinuous patches or electrically conductive material. The twisted pair(s) 105 may extend essentially parallel with the major or longitudinal axis/dimension of the shield layer 120. Thus, the twisted pair(s) 105 can be viewed as being parallel to the surface or plane of the shield layer 120. Alternatively, the twisted pair(s) 105 can be viewed as being over or under the shield layer 120 or being situated along the center axis of the shield layer 120. In other embodiments, the twisted pair(s) 105 can be viewed as being essentially parallel to one or both edges of the shield layer 120.

In certain applications, two conductors, which are typically individually insulated, will be twisted together to form a twisted pair 105. The shield layer 120 may then be wrapped around the twisted pair 105. Alternatively, the shield layer may be wrapped around multiple twisted pairs of conductors, such as twisted pairs that have been twisted, bunched, or cabled together. During wrapping, the long edges of the shield layer 120 may be brought up over the twisted pair(s)

105, thereby encasing the twisted pair(s) 105 or wrapping the shield layer 120 around or over the twisted pair(s) 105. In an example embodiment, the motion can be characterized as folding or curling the shield layer 120 over the twisted pair(s) 105. As desired, the long edges of the shield layer 120 can overlap one another following the illustrated motion.

In certain embodiments, the shield layer 120 may be wrapped around the twisted pair(s) 105 without substantially spiraling the shield layer 120 around or about the twisted pair(s) 105. Alternatively, the shield layer 120 may be wrapped so as to spiral around the twisted pair(s) 105. Additionally, in certain embodiments, the conductive patches may face inward, towards the twisted pair(s) 105. In other embodiments, the conductive patches may face away from the twisted pair(s) 105, towards the exterior of a cable. In yet other embodiments, conductive patches may be formed on both sides of the shield layer 120.

In one example embodiment, the shield layer 120 and the twisted pair(s) 105 are continuously fed from reels, bins, containers, or other bulk storage facilities into a narrowing chute or a funnel that curls the shield layer 120 over the twisted pair(s) 105. Downstream from this mechanism (or as a component of this mechanism), a nozzle or outlet port can extrude a polymeric jacket, skin, casing, or sheath over the shield layer 120 and twisted pairs 105.

Additionally, during construction of a cable, any desired components of the cable (e.g., the twisted pairs, the separator, tapes, yarns, insulation materials, water-swellable materials, flame retardant materials, shielding materials, etc.) may be helically stranded or twisted together. This twisting may results in a relatively tight coupling between certain components of the cable. For example, a relatively tight coupling may be formed between the twisted pairs and the various portions of a separator. This coupling may prohibit or limit movement of the portions of the separator along the longitudinal direction of the cable. Accordingly, the unintentional formation of gaps that may lead to undesired contact between adjacent twisted pairs may be limited.

Figure 11:
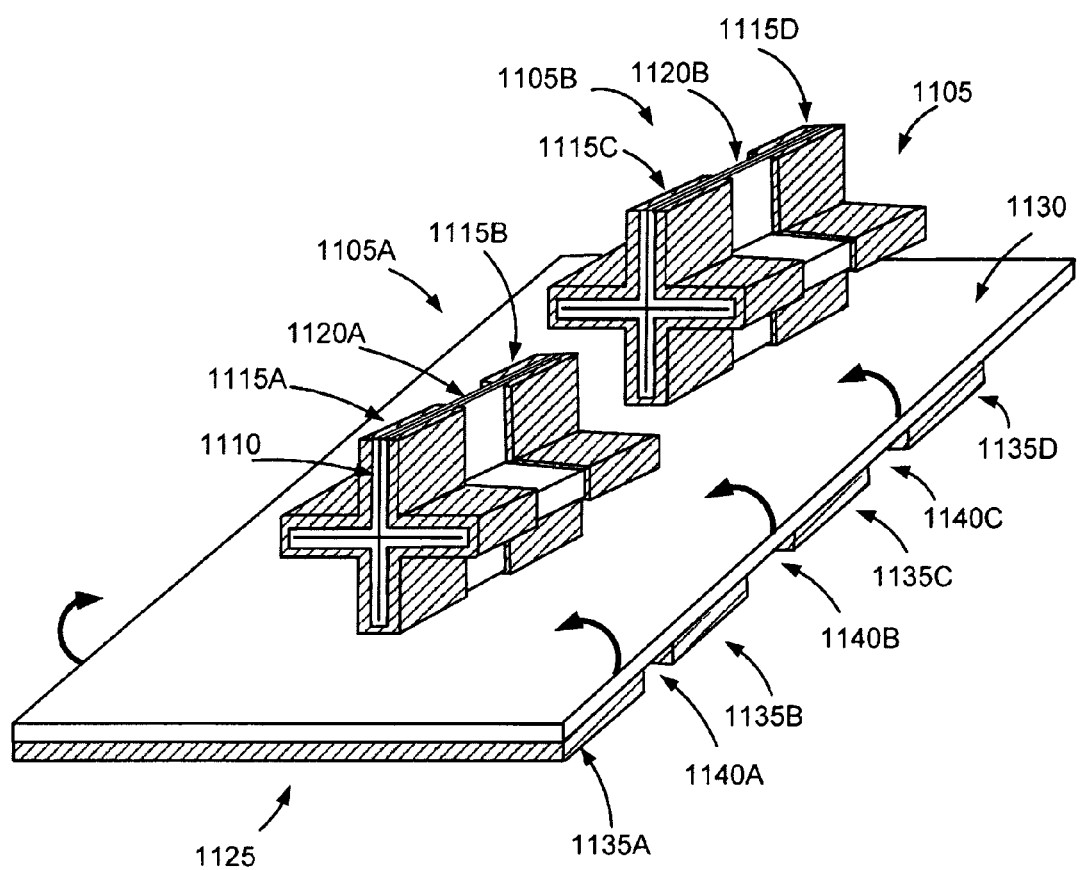
FIG. 11 illustrates an example separator and external shield that may be utilized in conjunction with twisted pairs in various embodiments of the disclosure.

FIG. 11 illustrates an example separator and external shield combination that may be utilized in conjunction with twisted pairs in various embodiments of the disclosure. The separator 1105 may be formed from a plurality of discrete separated segments 1105A, 1105B. As shown, each section 1105A, 1105B may be formed from a tape that is formed or processed into a desired shape, for example, by the die 900 illustrated in FIGS. 9A-9C. Each tape may include a substrate layer 1110 with patches 1115A, 1115B, 1115C, 1115D of electrically conductive material formed on the substrate layer 1110. Additionally, spaces or gaps such as spaces 1120A, 1120B may be present between adjacent patches of electrically conductive material. A shield layer 1125 may then be folded or wrapped around the separator 1105 and one or more other components of the cable, such as a plurality of twisted pairs (not shown). The shield layer 1125 may include a substrate layer 1130, and a plurality of patches 1135A-D of electrically conductive material may be formed on the substrate layer 1130. Additionally, spaces or gaps such as spaces 1140A-C, may be present between adjacent patches 1135A-D of electrically conductive material. In certain embodiments, the spaces or gaps formed between adjacent electrically conductive patches of the separator 1105 may correspond to or align with the spaces or gaps formed between adjacent electrically conductive patches of the shield 130.

Conditional language, such as, among others, "can," "could," "might," or "may," unless specifically stated otherwise, or otherwise understood within the context as used, is generally intended to convey that certain embodiments could include, while other embodiments do not include, certain features, elements, and/or operations. Thus, such conditional language is not generally intended to imply that features, elements, and/or operations are in any way required for one or more embodiments or that one or more embodiments necessarily include logic for deciding, with or without user input or prompting, whether these features, elements, and/or operations are included or are to be performed in any particular embodiment.

Many modifications and other embodiments of the disclosure set forth herein will be apparent having the benefit of the teachings presented in the foregoing descriptions and the associated drawings. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A cable, comprising:
a plurality of twisted pairs of individually insulated electrical conductors;
a separator disposed between at least two of the plurality of twisted pairs and having a cross-sectional shape comprising one of (i) a cross shape, (ii) a T-shape, (iii) a Y-shape, (iv) an L-shape, (v) a J-shape, or (vi) a diamond shape or (vii) a rod shape, the separator comprising a plurality of discrete sections respectively positioned along a longitudinal length of the cable, each section comprising electrically conductive material, wherein the separator does not include any components that extend along the longitudinal length to connect two or more of the discrete sections; and
a jacket formed around the plurality of twisted pairs and the separator.

2. The cable of claim 1, wherein each section of the separator comprises:
a first end comprising dielectric material; and
a second end longitudinally opposite the first end and comprising dielectric material,
wherein the electrically conductive material is positioned between the first end and the second end.

3. The cable of claim 1, wherein the electrically conductive material comprises one of (i) electrically conductive material formed on a dielectric material, (ii) electrically conductive material embedded in a dielectric material, (iii) electrically conductive material impregnated into a dielectric material, or (iv) substantially solid electrically conductive material.

4. The cable of claim 1, wherein the electrically conductive material associated with each section comprises at least one patch of electrically conductive material.

5. The cable of claim 4, wherein each patch of electrically conductive material has a length between approximately one meter and approximately three meters.

6. The cable of claim 1, wherein a respective gap is formed between each set of adjacent discrete sections of the separator.

7. The cable of claim 1, wherein each discrete section of the separator has a common longitudinal length.

8. The cable of claim 1, wherein a first discrete section of the separator has a first longitudinal length and a second discrete section of the separator has a second longitudinal length different than the first longitudinal length.

9. The cable of claim 1, wherein each discrete section of the separator has a longitudinal length of approximately three meters or less.

10. The cable of claim 1, further comprising:
a shield layer disposed between at least one of the plurality of twisted pairs and the jacket, wherein the shield layer comprises a plurality of patches of electrically conductive material.

11. The cable of claim 10, wherein the shield layer is circumferentially wrapped around all of the plurality of twisted pairs.

12. The cable of claim 10, wherein the electrically conductive material associated with each section of the separator comprises at least one patch of electrically conductive material,
wherein first spaces are formed between adjacent patches of the electrically conductive material along a longitudinal length of the separator, and
wherein second spaces corresponding to the first spaces are formed between adjacent patches of electrically conductive material along a longitudinal length of the shield layer.

13. A cable comprising:
a plurality of individually insulated electrical conductors;
a flexible member comprising an X-shaped cross-section disposed between at least two of the conductors and extending along a longitudinal length, the flexible member consisting of a plurality of disconnected portions that each have a respective length that is less than the longitudinal length, the plurality of portions comprising a first portion and a second portion separate from the first portion, wherein the first and second portions are positioned adjacent to one another in a longitudinal direction of the cable; and
a jacket formed around the plurality of conductors and the flexible member.

14. The cable of claim 13, wherein the first portion is formed from a first material and the second portion is formed from a second material different from the first material.

15. The cable of claim 13, wherein a gap is formed in the longitudinal direction between the first portion and the second portion.

16. The cable of claim 13, wherein each of the first portion and the second portion comprise electrically conductive material.

17. A cable comprising:
a plurality of twisted pairs of individually insulated electrical conductors;
a separator positioned between at least two of the plurality of twisted pairs and having a cross-sectional shape comprising one of (i) a cross shape, (ii) a T-shape, (iii) a Y-shape, (iv) an L-shape, (v) a J-shape, or (vi) a diamond shape or (vii) a rod shape, the separator comprising a plurality of discrete sections respectively positioned along a longitudinal length of the cable with no component of the separator connecting any of the discrete sections, each section comprising first electrically conductive material;
a shield layer formed around the plurality of twisted pairs, the shield layer comprising second electrically conductive material; and
a jacket formed around the plurality of twisted pairs and the separator.

18. The cable of claim 17, wherein the first electrically conductive material comprises first discontinuous patches of electrically conductive material having respective first gaps formed between adjacent patches, and
wherein the second electrically conductive material comprises second discontinuous patches of electrically conductive material having respective second gaps formed between adjacent patches and corresponding to the first gaps.

19. The cable of claim 18, wherein each of the first discontinuous patches and the second discontinuous patches has a length between approximately one meter and approximately three meters.

20. The cable of claim 17, wherein the shield layer is disposed between the plurality of twisted pairs and the jacket.

* * * * *